(12) United States Patent
Yamaguchi et al.

(10) Patent No.: US 8,575,039 B2
(45) Date of Patent: Nov. 5, 2013

(54) SURFACE TREATING METHOD AND FILM DEPOSITING METHOD

(75) Inventors: Tatsuya Yamaguchi, Yamanashi (JP); Hiroyuki Hashimoto, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 13 days.

(21) Appl. No.: 13/425,514

(22) Filed: Mar. 21, 2012

(65) Prior Publication Data
US 2013/0072029 A1   Mar. 21, 2013

(30) Foreign Application Priority Data

Mar. 24, 2011 (JP) ................................. 2011-066463

(51) Int. Cl.
*H01L 21/312* (2006.01)
(52) U.S. Cl.
USPC ........... 438/763; 438/780; 438/906; 438/909; 438/974; 257/E21.259; 427/207.1
(58) Field of Classification Search
USPC .......................... 438/763, 780, 906, 909, 974; 257/E21.259; 427/96.8, 207.1
See application file for complete search history.

(56) References Cited

U.S. PATENT DOCUMENTS

| | | | | |
|---|---|---|---|---|
| 5,134,021 A | * | 7/1992 | Hosono et al. | ................. 428/213 |
| 5,702,792 A | * | 12/1997 | Iida et al. | ..................... 428/64.1 |
| 5,869,219 A | * | 2/1999 | Kuo et al. | .................. 430/270.1 |
| 8,445,894 B2 | * | 5/2013 | Nakamura et al. | .............. 257/40 |
| 2002/0015800 A1 | * | 2/2002 | Miyamoto et al. | ............. 427/553 |
| 2004/0107905 A1 | * | 6/2004 | Sheu | ......................... 118/723 E |
| 2011/0188173 A1 | * | 8/2011 | Ota et al. | ....................... 361/525 |
| 2011/0244131 A1 | * | 10/2011 | Kawamura et al. | ........... 427/256 |
| 2012/0003484 A1 | * | 1/2012 | Roehrig et al. | ............... 428/447 |
| 2013/0111753 A1 | * | 5/2013 | Nihei | ........................... 29/890.1 |

FOREIGN PATENT DOCUMENTS

| | | | |
|---|---|---|---|
| JP | 05-095058 | | 4/1993 |
| JP | 2006231134 A | * | 9/2006 |
| JP | 4283910 | | 6/2009 |
| JP | 2010-024484 | | 2/2010 |

OTHER PUBLICATIONS

Translation JP 2006-231134 (partial) pp. 1-7 (2006).*

* cited by examiner

*Primary Examiner* — George Fourson, III
(74) *Attorney, Agent, or Firm* — IPUSA, PLLC

(57) ABSTRACT

A surface treating method for treating a surface of a substrate inside a process chamber includes the steps of generating an atmosphere containing no moisture in the process chamber, heating the substrate inside the atmosphere containing no moisture in the process chamber; and causing a reaction between the substrate and an adhesion accelerating agent by feeding the adhesion accelerating agent gas into the process chamber.

8 Claims, 16 Drawing Sheets

SURFACE TREATING METHOD AND FILM DEPOSITING METHOD

CROSS-REFERENCE TO RELATED APPLICATION

The present application is based upon and claims the benefit of priority of Japanese Patent Application No. 2011-066463, filed on Mar. 24, 2011, the entire contents of which are incorporated herein by reference.

BACKGROUND OF THE INVENTION

1. Field of the Invention

The present invention relates to a surface treating method for treating a surface of a substrate and a film depositing method for depositing a film on the substrate.

2. Description of the Related Art

In recent years, a wide range of materials from inorganic materials to organic materials are used for a semiconductor device. The characteristics of the organic materials (of which inorganic materials do not have) help to optimize the properties of the semiconductor device and the manufacturing process of the semiconductor device.

One of the organic materials is polyimide. Polyimide has a high insulating property. Therefore, a polyimide film obtained by depositing polyimide on a surface of a substrate can be used as an insulating film, and as an insulating film of a semiconductor device.

As a method for depositing the polyimide film, a film deposition method is known, where vapor deposition polymerization is performed by using, for example, pyromellitic dianhydride (PMDA) and 4,4'-oxydianiline (ODA) as raw material monomers. Vapor deposition polymerization is a method that causes thermal polymerization of pyromellitic dianhydride (PMDA) and 4,4'-oxydianiline (ODA) (being used as raw material monomers) on a surface of a substrate (see, for example, Japanese Patent No. 4283910). Japanese Patent No. 4283910 discloses a film deposition method where a polyimide film is deposited by vaporizing PMDA and ODA monomers in a vaporizer, feeding each of the vaporized gases to a vapor deposition polymerization chamber, and causing vapor deposition polymerization on a substrate.

However, the film deposition apparatus which deposits a polyimide film by supplying the above-described PMDA gas and ODA gas to the substrate has the following problems.

In order to improve the adhesive property of the polyimide film deposited on the substrate, surface treating is to be performed with an adhesion accelerating agent before depositing the polyimide film. The surface treatment using the adhesion accelerating agent may be performed by treating the surface of the substrate with an adhesion accelerating agent such as a silane coupling agent. Further, in order to cause hydrolysis of the silane coupling agent when treating the substrate surface with the silane coupling agent, water vapor is to be applied to the substrate together with the silane coupling agent.

However, in a case where water vapor that is fed during the surface treatment is remaining, a source gas would react to the water vapor and change the property of a film being deposited on the surface treated substrate. Thus, the film may not be satisfactorily deposited. Further, particles may be generated due to polymerization between the silane coupling agent contained in the adhesion accelerating agent and the water vapor.

Further, in order to perform surface treatment by supplying the silane coupling agent and the water vapor, the surface of the substrate is to be terminated with a hydroxyl group. Therefore, in a case where a Si wafer is used as the substrate, the surface of the substrate is to be terminated with a hydroxyl group after performing dilute hydrofluoric (DHF) cleaning, terminating the surface of the substrate with hydrogen, and cleaning the surface of the substrate by ammonia peroxide (standard clean, (SC) 1) cleaning. This results in a problem of requiring many steps for adjusting the terminating state of the substrate surface.

The aforementioned problem no only applies to a case of depositing a polyimide film on a substrate by feeding a source gas formed of PMDA gas or a source gas formed of ODA gas, but also to a case of depositing various films by feeding various source gases on a substrate.

SUMMARY OF THE INVENTION

In view of the above, an embodiment of the present invention provides a surface treating method and a film depositing method that can prevent changing of the property of a film deposited on a surface treated substrate, prevent generation of particles during surface treatment, and reduce the number of preliminary steps for adjusting the terminated state of the substrate.

According to an embodiment of the present invention, there is provided a surface treating method for treating a surface of a substrate inside a process chamber including the steps of: generating an atmosphere containing no moisture in the process chamber; heating the substrate inside the atmosphere containing no moisture in the process chamber; and causing a reaction between the substrate and an adhesion accelerating agent by feeding the adhesion accelerating agent gas into the process chamber.

According to another embodiment of the present invention, there is provided a film depositing method including the steps of: generating an atmosphere containing no moisture in a film deposition chamber for depositing a film on a substrate; supplying an adhesion accelerating agent gas into the film deposition chamber until the substrate is heated to a predetermined temperature for depositing the film; treating a surface of the substrate with the adhesion accelerating agent gas inside the atmosphere containing no moisture in the film deposition chamber; and depositing the film on the substrate by feeding a source gas into the film deposition chamber after the step of treating the surface of the substrate.

The object and advantages of the present invention will be realized and attained by means of the elements and combinations particularly pointed out in the claims.

It is to be understood that both the foregoing general description and the following detailed description are exemplary and explanatory and not restrictive of the invention as claimed.

BRIEF DESCRIPTION OF THE DRAWINGS

The accompanying drawings, which are incorporated in and constitute a part of the specification, illustrate embodiments of the invention, and together with the general description given above and the detailed description of the embodiments given below, serve to explain the principles of the invention, in which.

DETAILED DESCRIPTION OF THE PREFERRED EMBODIMENT

Next, a description is given, with reference to the accompanying drawings, of embodiments of the present invention.
[First Embodiment]
First, a description is given, with reference to FIG. 1 through FIG. 12, of a surface treating method and a film depositing method according to the first embodiment of the present invention.

The film depositing method according to this embodiment may be applied to a film deposition apparatus configured to deposit a polyimide film on a substrate held in a film deposition chamber by feeding the substrate with a first raw material gas, which is, for example, vaporized pyromellitic dianhydride (hereinafter abbreviated as "PMDA"), and a second raw material gas, which is, for example, vaporized 4,4'-3 oxydianiline (hereinafter, abbreviated as "ODA").

Figure 1:
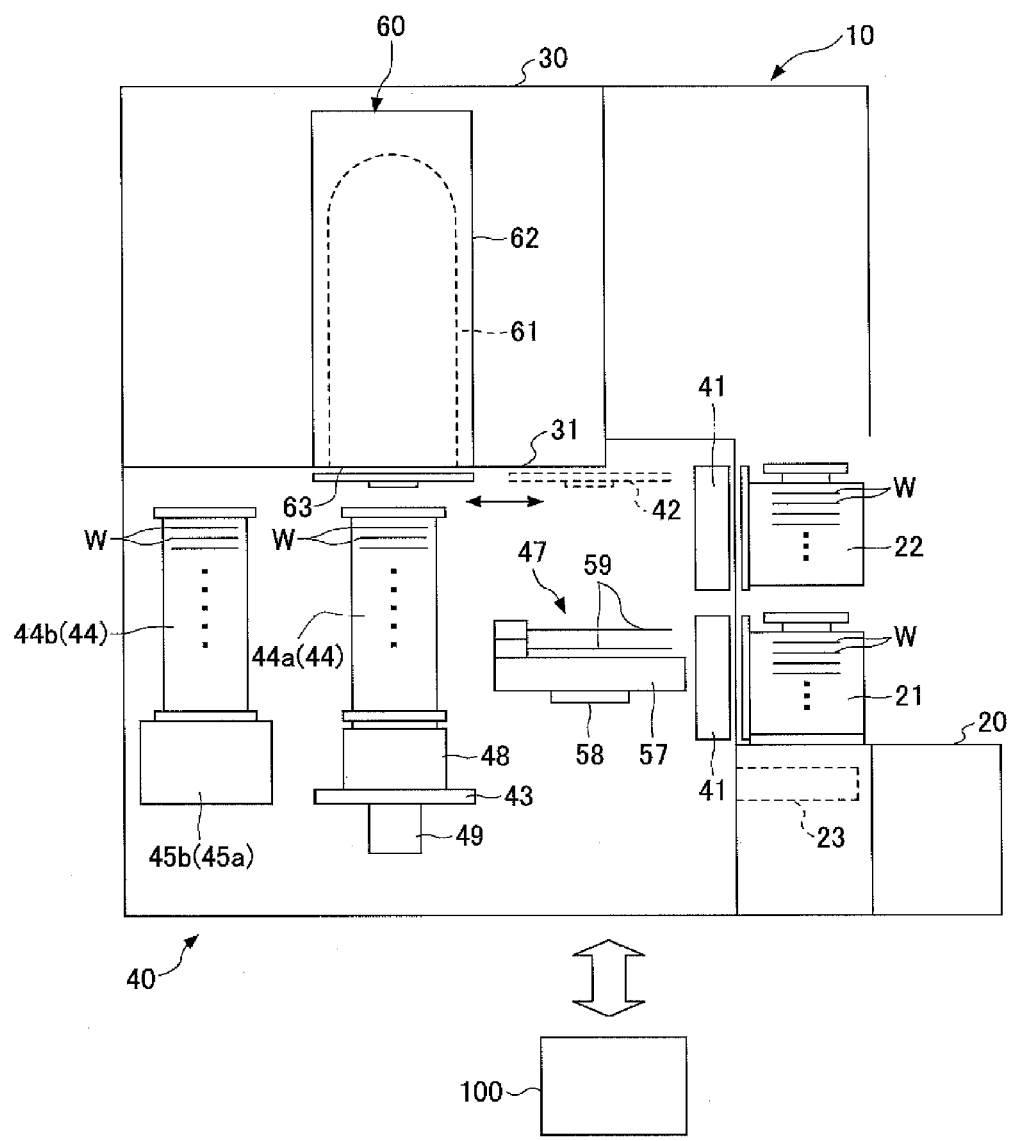
FIG. 1 is a schematic longitudinal cross-sectional view of a film deposition apparatus used for performing a surface treating method and a film depositing method according to a first embodiment of the present invention.
Figure 2:
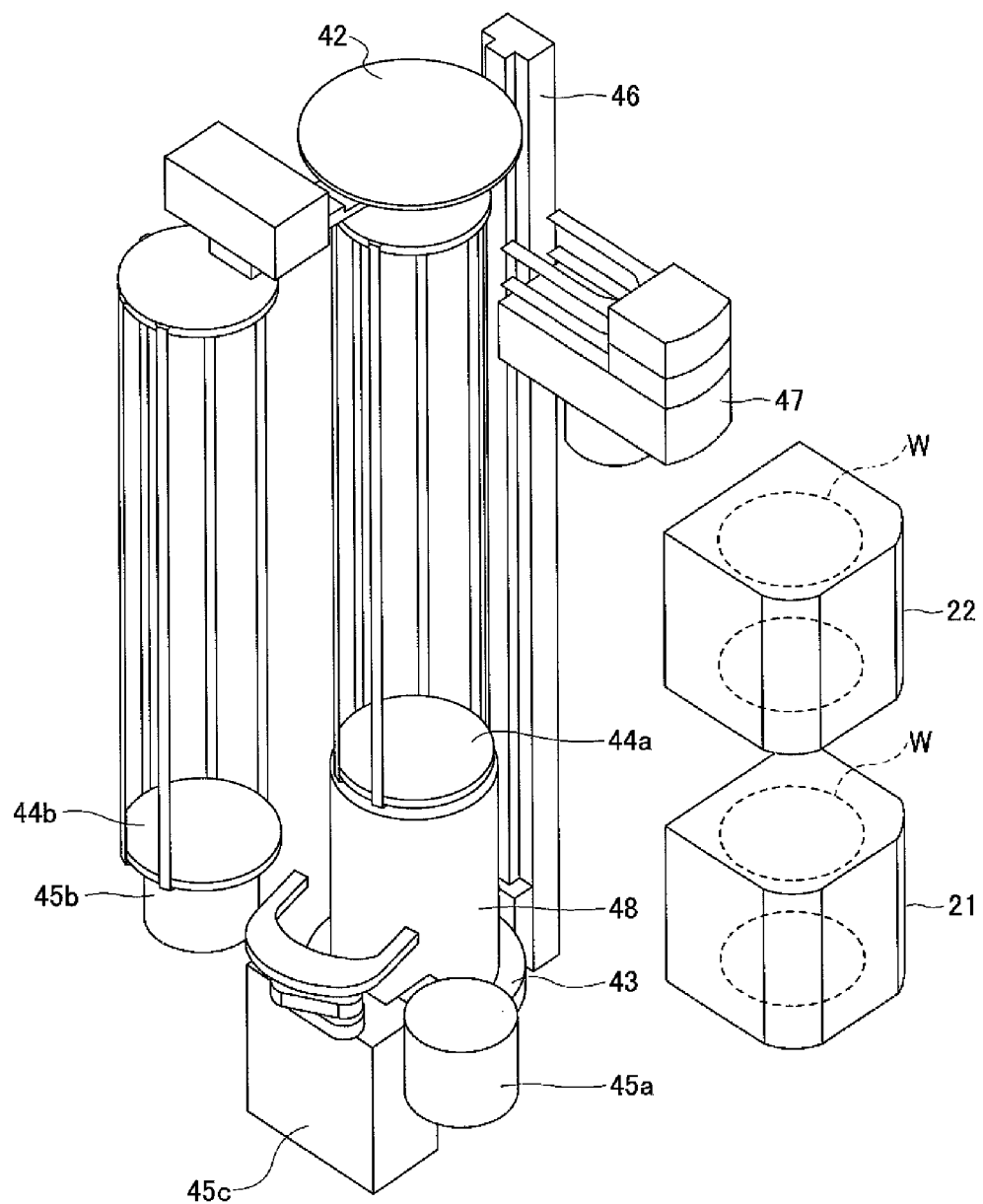
FIG. 2 is a schematic perspective view of a loading area according to an embodiment of the present invention.
Figure 3:
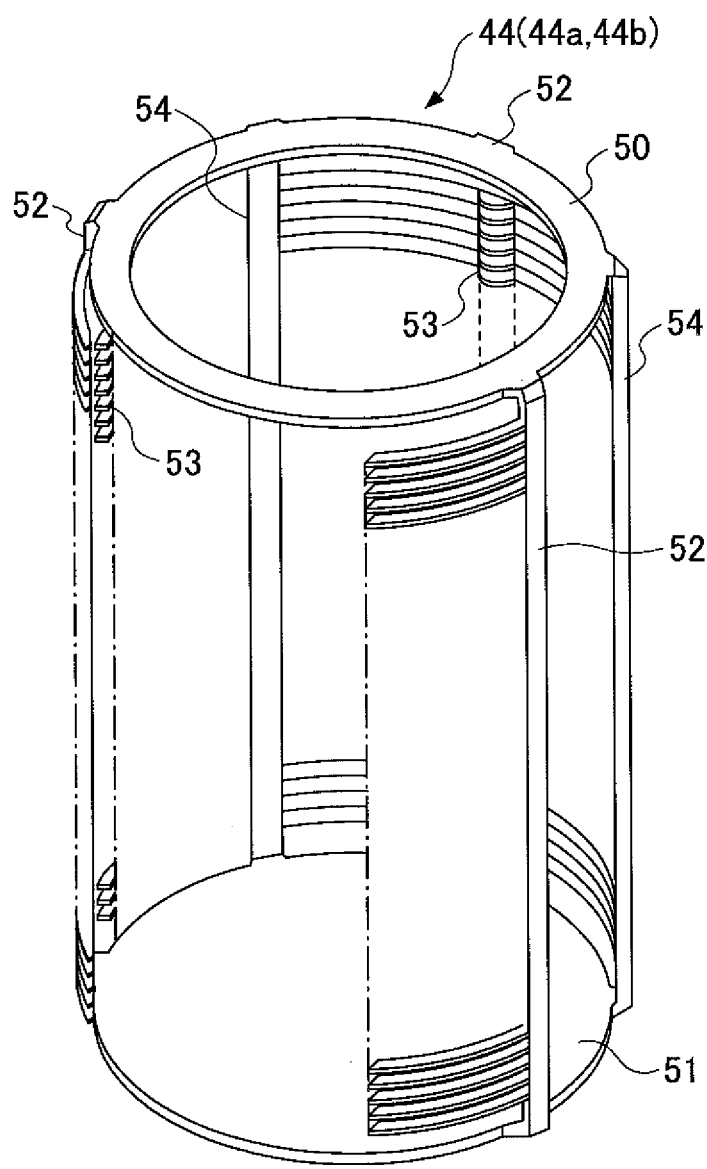
FIG. 3 is a perspective view of a boat according to an embodiment of the present invention.

FIG. 1 is a schematic longitudinal cross-sectional view illustrating a film deposition apparatus 10 for performing the surface treating method and the film depositing method according to this embodiment. FIG. 2 is a schematic perspective view of a loading area 40. FIG. 3 is a perspective view illustrating an example of a boat 44.

The film deposition apparatus 10 includes a placement table (load port) 20, a housing 30, and a control part 100.

The placement table 20 is provided on the front side of the housing 30. The housing 30 includes the loading area (work area) 40 and the film deposition chamber 60. The loading area 40 is provided in a lower part of the housing 30. The film deposition chamber 60 is provided above the loading area 40 in the housing 30. Further, a base plate 31 is provided between the loading area 40 and the film deposition chamber 60. The below-described feeding mechanism 70 is provided in a manner connected to the film deposition chamber 60.

The base plate 31 is, for example, a stainless steel base plate for providing a reaction tube 61 of the film deposition chamber 60. An opening, not graphically illustrated, is formed in the base plate 31 to allow insertion of the reaction tube 61 from bottom up.

The placement table 20 is for carrying the wafers W into and out of the housing 30. Containers 21 and 22 are placed on the placement table 20. The containers 21 and 22 are closable containers (front-opening unified pods or FOUPs) having a detachable lid, which is not graphically illustrated, on the front and accommodate multiple, for example, approximately 50 wafers at predetermined intervals.

Further, an aligning unit (aligner) 23 configured to align notched parts (notches) provided in the peripheries of the wafers W transferred by the below-described transfer mechanism 47 in a single direction may be provided below the placement table 20.

The loading area 40 is a work area for transferring the wafers W between the containers 21, 22 and the boat 44, carrying (loading) the boat 44 into the film deposition chamber 60, and carrying out (unloading) the boat 44 from the film deposition chamber 60. Door mechanisms 41, a shutter mechanism 42, a lid body 43, the boat 44, bases 45a and 45b, an elevation mechanism 46, and the transfer mechanism 47 are provided in the loading area 40.

It is to be noted that the lid body 43 and the boat 44 may correspond to a substrate holding part, according to an aspect of the present invention.

The door mechanisms 41 are configured to remove the lids of the containers 21 and 22 to cause the containers 21 and 22 to communicate with and be open to the inside of the loading area 40.

The shutter mechanism 42 is provided in an upper part of the loading area 40. The shutter mechanism 42 is so provided as to cover (or close) the below-described opening 63 of the film deposition chamber 60 to control or prevent a release of the heat inside the film deposition chamber 60 at high temperature to the loading area 40 through the opening 63 when the lid body 43 is open.

The lid body 43 includes a heat insulating tube 48 and a rotation mechanism 49. The heat insulating tube 48 is provided on the lid body 43. The heat insulating tube 48 prevents the boat 44 from being cooled through a transfer of heat with the lid body 43, and keeps heat in the boat 44. The rotation mechanism 49 is attached to the bottom of the lid body 43. The rotation mechanism 49 causes the boat 44 to rotate. The rotating shaft of the rotation mechanism 49 is so provided as to pass through the lid body 43 in a hermetic manner to rotate a rotating table, which is not graphically illustrated, provided on the lid body 43.

The elevation mechanism 46 drives the lid body 43 to move up and down when the boat 44 is carried into the film deposition chamber 60 from the loading area 40 and out of the film deposition chamber 60 to the loading area 40. The lid body 43 is so provided as to come into contact with the opening 63 to hermetically close the opening 63 when the lid body 43, moved upward by the elevation mechanism 46, has been carried into the film deposition chamber 60. The boat 44 placed on the lid body 43 may hold the wafers W in the film deposition chamber 60 in such a manner as to allow the wafers W to rotate in a horizontal plane.

The film deposition apparatus 10 may have multiple boats 44. In this embodiment, a description is given below, with reference to FIG. 2, of a case where the film deposition apparatus 10 includes two boats 44a and 44b, which may also be collectively referred to as the "boat 44" when there is no need to make a distinction between the boats 44a and 44b in particular.

The boats 44a and 44b are provided in the loading area 40. The bases 45a and 45b and a boat conveying mechanism 45c are provided in the loading area 40. The bases 45a and 45b are placement tables onto which the boats 44a and 44b are transferred from the lid body 43, respectively. The boat conveying mechanism 45c transfers the boats 44a and 44b from the lid body 43 to the bases 45a and 45b, respectively.

The boats 44a and 44b are made of, for example, quartz, and are configured to have the wafers W, which are large, for example, 300 mm in diameter, loaded in a horizontal position at predetermined intervals (with predetermined pitch width) in a vertical direction. For example, as illustrated in FIG. 3, the boats 44a and 44b have multiple, for example, three columnar supports 52 are provided between a top plate 50 and a bottom plate 51. The columnar supports 52 are provided with claw parts 53 for holding the wafers W. Further, auxiliary columns 54 may suitably be provided together with the columnar supports 52.

The transfer mechanism 47 is configured to transfer the wafers W between the containers 21 and 22 and the boats 44 (44a and 44b). The transfer mechanism 47 includes a base 57, an elevation arm 58, and plural forks (transfer plates) 59. The base 57 is so provided as to be vertically movable and turnable. The elevation arm 58 is, for example, so provided as to be vertically movable (movable upward and downward) with a ball screw or the like. The base 57 is so provided as to be horizontally movable (turnable) relative to the elevation arm 58.

Figure 4:
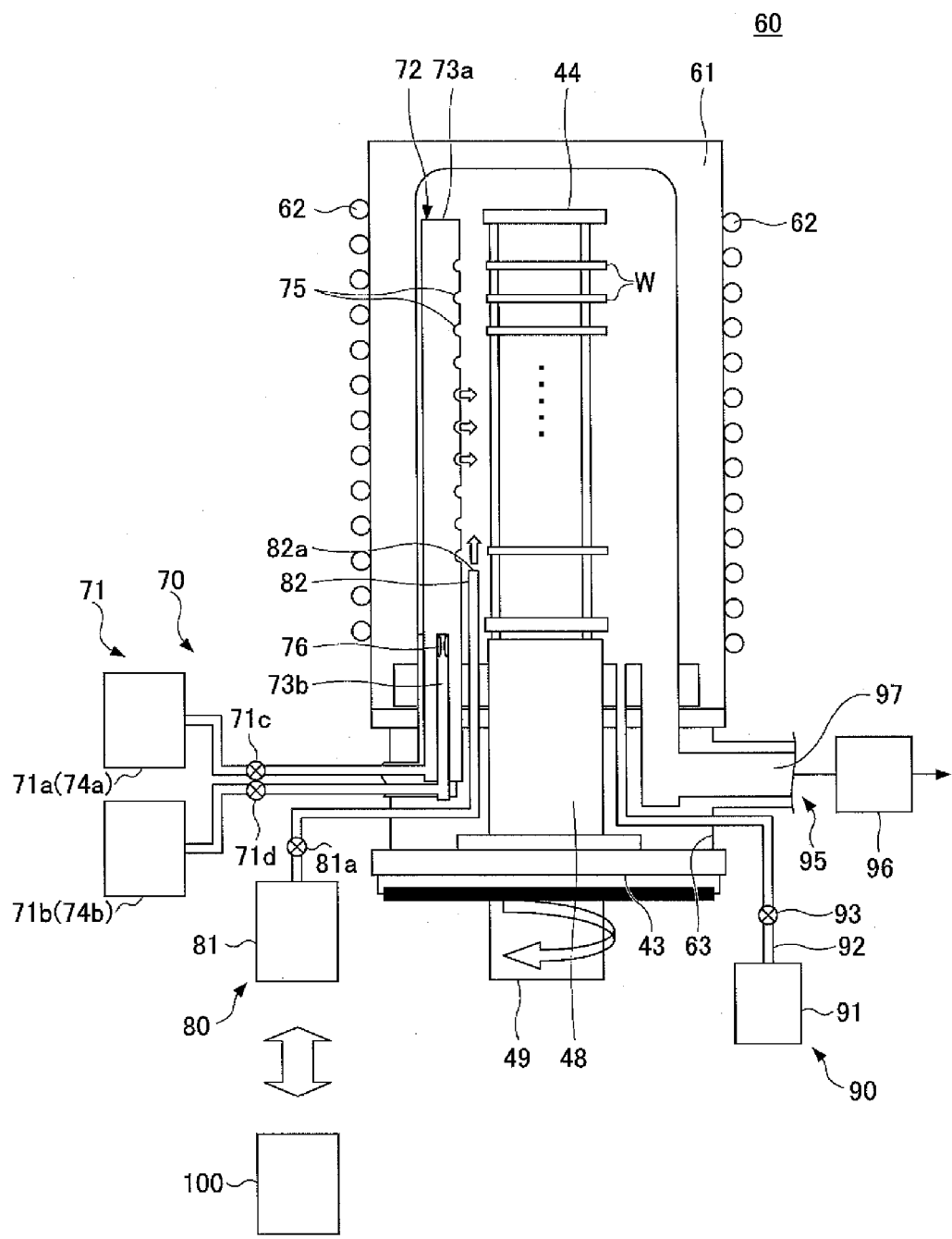
FIG. 4 is a cross-sectional view of a configuration of a film deposition chamber according to an embodiment of the present invention.

FIG. 4 is a cross-sectional view illustrating a configuration of the film deposition chamber 60 according to an embodiment of the present invention.

The film deposition chamber 60 may be, for example, a vertical furnace that accommodates multiple substrates to be processed (treated), such as thin disk-shaped wafers W, and performs a predetermined process such as CVD on the substrates to be processed. The film deposition chamber 60 includes the reaction tube 61, a heater 62, a cooling mechanism 65, a feed mechanism 70, adhesion accelerating agent feed mechanism 80, a purge gas feed mechanism 90, and an exhaust mechanism 95.

It is to be noted that the heater 62 may correspond to a heating mechanism according to an aspect of the present invention.

The reaction tube 61 is made of, for example, quartz, has a vertically elongated shape, and has the opening 63 formed at the lower end. The heater (heating apparatus) 62 is so provided as to cover the periphery of the reaction tube 61, and may control heating so that the inside of the reaction tube 61 is heated to a predetermined temperature, for example, 50° C. to 1200° C.

The feed mechanism 70 includes a source gas feeding part 71 and an injector 72 provided inside the film deposition chamber 60. The injector 72 includes a feeding tube 73a. The source gas feeding part 71 is connected to the feeding tube 73a of the injector 72.

In this embodiment, the feed mechanism 70 may include a first source gas feeding part 71a and a second source gas feeding part 71b. The first and the second source gas feeding parts 71a, 71b are connected to the injector 72 (feeding tube 73a) via valves 71c, 71d, respectively. The first source gas feeding part 71a includes a first vaporizer 74a configured to vaporize, for example, a PMDA source material. Thus, the first source gas feeding part 71a can feed PMDA gas. The second source gas feeding part 71b includes a second vaporizer 74b configured to vaporize, for example, an ODA source material.

A feeding hole 75 is formed in the feeding tube 73a as an opening toward the inside of the film deposition chamber 60. The injector 72 feeds the first and the second source gases flowing from the source gas feeding part 71 to the feeding tube 73a into the film deposition chamber 60 via the feeding hole 75.

Further, the feeding tube 73a may be provided in a manner extending in a vertical direction. Further, plural feeding holes 75 may be formed in the feeding tube 73a. The feeding hole 75 may have various shapes such as a circular shape, an elliptical shape, or a rectangular shape.

It is preferable for the injector 72 to include an inner feeding tube 73b. The inner feeding tube 73b may be formed in a portion that is upstream than a portion which the feeding hole of the feeding tube 73a is formed. Further, an opening 76 may be formed in the vicinity of a downstream side of the inner feeding tube 73b for feeding either the first or the second source gas to the inner space of the feeding tube 73a. With the inner feeding tube 73b having the above-described configuration, the first and the second source gases can be sufficiently mixed inside the inner space of the feeding tube 73a prior to feeding the first and the second source gases from the feeding hole 75 to the inside of the film deposition chamber 60.

The following embodiment is a case where the first source gas is fed to the feeding tube 73a and the second source gas is fed to the inner feeding tube 73b. Alternatively, the first source gas may be fed to the inner feeding tube 73b, and the second source gas may be fed to the feeding tube 73a.

The opening 76 may have various shapes such as a circular shape, an elliptical shape, or a rectangular shape.

In this embodiment, the boat 44 may have multiple wafers W vertically accommodated therein at predetermined intervals. In this embodiment, the feeding tube 73a and the inner feeding tube 73b may be provided in a manner extending in a vertical direction. Further, assuming that a lower part of the feeding tube 73a corresponds to an upstream side and an upper part of the feeding tube 73a corresponds to a downstream side, the inner feeding tube 73b may be installed inside the feeding tube 73a in a position lower than the part which the feeding hole of the feeding tube 73a is formed. Further, the opening 76 for communicating with the inner space of the feeding tube 73a may be provided in the vicinity of an upper end part of the inner feeding tube 73b.

The feed mechanism 70 is configured to have, for example, the first source gas flow through the feeding tube 73a and the second source gas flow through the inner feeding tube 73b. The second source gas flows from the inner feeding tube 73b to the feeding tube 73a via the opening 76. Thereby, the first and the second source gases are mixed. In such mixed state, the first and the second source gases are fed into the film deposition chamber 60 via the feeding hole 75.

Figure 5:
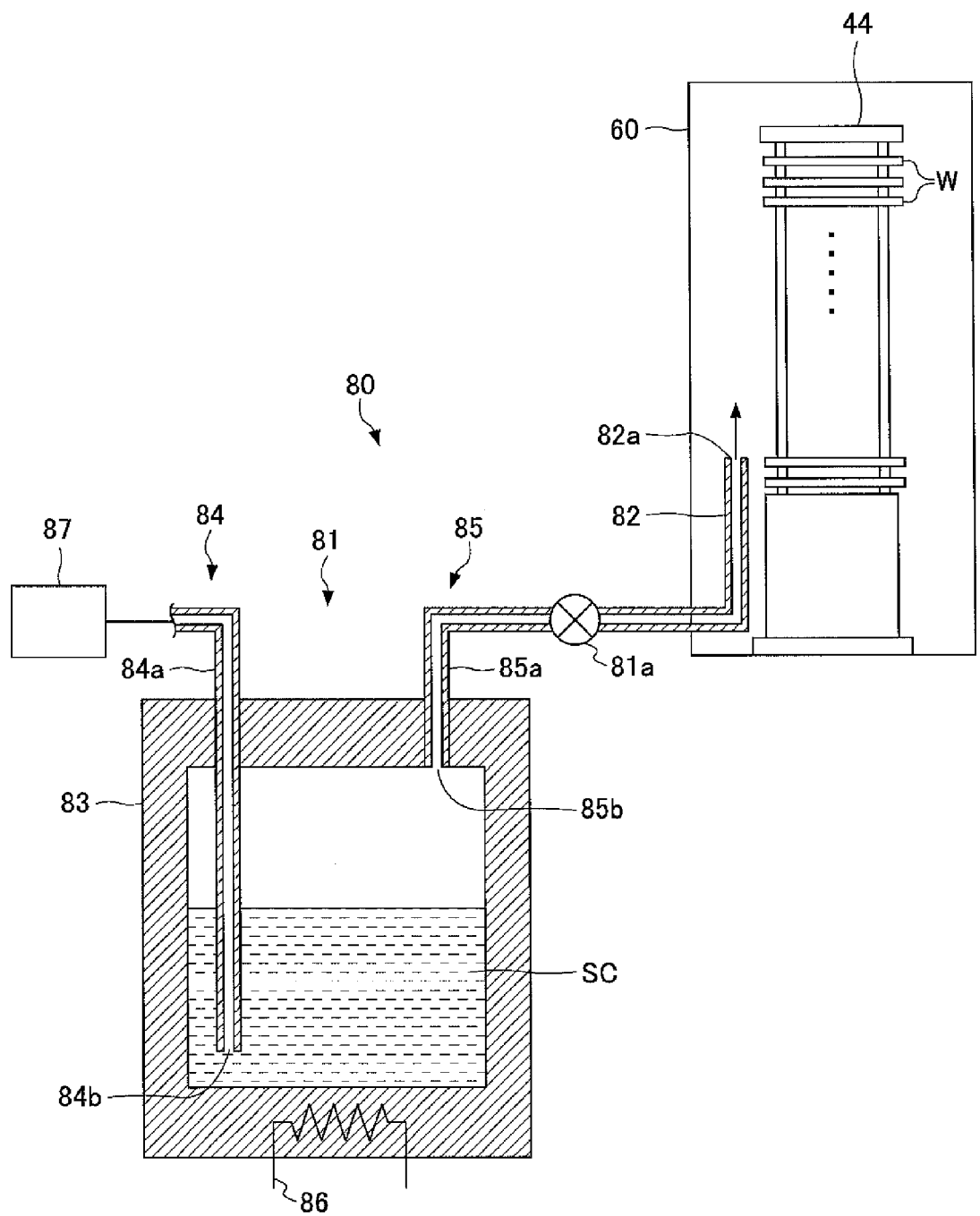
FIG. 5 is a schematic diagram illustrating a configuration of an adhesion accelerating agent feed mechanism according to an embodiment of the present invention.

FIG. 5 is a schematic diagram illustrating a configuration of an adhesion accelerating agent feed mechanism 80 according to an embodiment of the present invention. It is to be noted that components other than those of the film deposition chamber 60, the boat 44, and the adhesion accelerating agent feed mechanism 80 are not illustrated in FIG. 5.

As illustrated in FIG. 5, the adhesion accelerating agent feed mechanism 80 includes a vaporizer 81 and a feeding tube 82 provided inside the film deposition chamber 60. The vaporizer 81 is connected to the feeding tube 82 via a valve 81a. The adhesion accelerating agent feed mechanism 80 feeds an adhesion accelerating agent gas (formed by vaporizing the below-described adhesion accelerating agent SC) into the film deposition chamber 60 and treats the surface of the wafer W with the adhesion accelerating agent gas.

The vaporizer 81 includes a retaining container 83, a gas inlet part 84, and a gas outlet part 85.

The retaining container 83 is configured to have the adhesion coupling agent SC (e.g., silane coupling agent) filled therein. A heating mechanism 86 is provided inside the retaining container 83. The adhesion coupling agent SC filled inside the retaining container 83 can be heated and vaporized by the heating mechanism 86. It is to be noted that a heater or the like may be used as the heating mechanism 86. As long as the retaining container 83 can be heated, the heating mechanism 86 can be arbitrarily positioned in a given part of the retaining container 83.

The gas inlet part 84 guides an adhesion accelerating agent carrier gas formed of an inert gas (e.g., nitrogen ($N_2$)) from an adhesion accelerating agent carrier gas feeding part 87, so that the adhesion accelerating agent gas can be carried by the adhesion accelerating agent carrier gas. The gas inlet part 84 includes a gas inlet tube 84a and a gas inlet port 84b. The gas inlet tube 84a is a tube for guiding the adhesion accelerating agent carrier gas from the outside to the inside of the retaining container 83. The gas inlet tube 84a is attached to a top surface of the retaining container 83 in a manner penetrating through the top surface of the retaining container 83 and extending vertically (i.e. from top to bottom of the retaining container 83) into the retaining container 83. Further, one end of the gas inlet tube 84a has an opening at the bottom part of the retaining container 83 whereas the other end of the gas inlet tube 84a is connected to the adhesion accelerating agent carrier gas feeding part 87 outside the retaining container 83. The gas inlet port 84b corresponds to the opening formed on the bottom end of the gas inlet tube 84a.

FIG. 5 illustrates the gas inlet port 84b positioned below the liquid surface of the adhesion accelerating agent SC for bubbling the adhesion accelerating agent SC with the adhesion accelerating agent carrier gas fed from the gas inlet port 84b.

Alternatively, the gas inlet port 84b may be positioned above the liquid surface of the adhesion accelerating agent SC. In this case, the adhesion accelerating agent SC need not be bubbled with the adhesion accelerating agent carrier gas fed from the gas inlet port 84b.

The gas outlet part 85 guides the adhesion accelerating agent gas together with the adhesion accelerating agent carrier gas out from the retaining container 83. The gas outlet part 85 includes a gas outlet tube 85a and a gas outlet port 85b. The gas outlet tube 85a is a tube for guiding the adhesion accelerating agent gas and the adhesion accelerating agent carrier gas out from the retaining container 83. The gas outlet tube 85a is attached to the top surface of the retaining container 83 in a manner penetrating the top surface of the retaining container 83. Further, one end of the gas outlet tube 85a has an opening at an inner top part of the retaining container 83 whereas the other end of the gas outlet tube 85a is connected to a feeding tube 82 provided inside the film deposition chamber 60. The gas outlet port 85b corresponds to the opening formed on the bottom end of the gas outlet tube 85a.

The feeding tube 82, which is made of quartz, penetrates through the sidewall of the film deposition chamber 60 and bends in a manner extending upward. A feed opening 82a is formed at one end of the feeding tube 82 inside the film deposition chamber 60. The feeding tube 82 feeds the adhesion accelerating agent gas from the vaporizer 81 to the inside of the film deposition chamber 60 via the feed opening 82a. It is preferable for the feed opening 82a to be provided in one part in the film deposition chamber 60 in the vicinity of the wafer(s) W mounted on the boat 44. Thereby, the adhesion accelerating agent gas from the feed opening 82a can be evenly dispersed inside the film deposition chamber 60.

The purge gas feed mechanism 90 includes a purge gas feeding part 91 and a purge gas feeding tube 92. The purge gas feeding part 91 is connected to the film deposition chamber 60 via the purge gas feeding tube 92. The purge gas feeding part 91 feeds a purge gas into the film deposition chamber 60. A valve 93 is provided at a midsection of the purge gas feeding tube 92 for communicating or disconnecting the purge gas feeding part 91 with respect to the inside of the film deposition chamber 60.

The exhaust mechanism 95 includes an exhaust device 96 and an exhaust pipe 97. The exhaust mechanism 95 is configured to evacuate gas from the inside of the film deposition chamber 60 via the exhaust pipe 97.

The control part 100 includes, for example, a processing part, a storage part, and a display part, which are not illustrated in FIG. 4. The processing part is, for example, a computer including a central processing unit (CPU). The storage part is a computer-readable recording medium formed of, for example, hard disks, on which a program for causing the processing part to execute various processes is recorded. The display part is formed of, for example, a computer screen (display). The processing unit reads a program recorded in the storage part and transmits control signals to components of the boat 44a (substrate holding part), the heater 62, the cooling mechanism 65, the supply mechanism 70, the adhesion accelerating agent supply mechanism 80, the purge gas supply mechanism 90, and the exhaust mechanism 95 in accordance with the program, thereby executing the below-described film deposition process.

Figure 6:
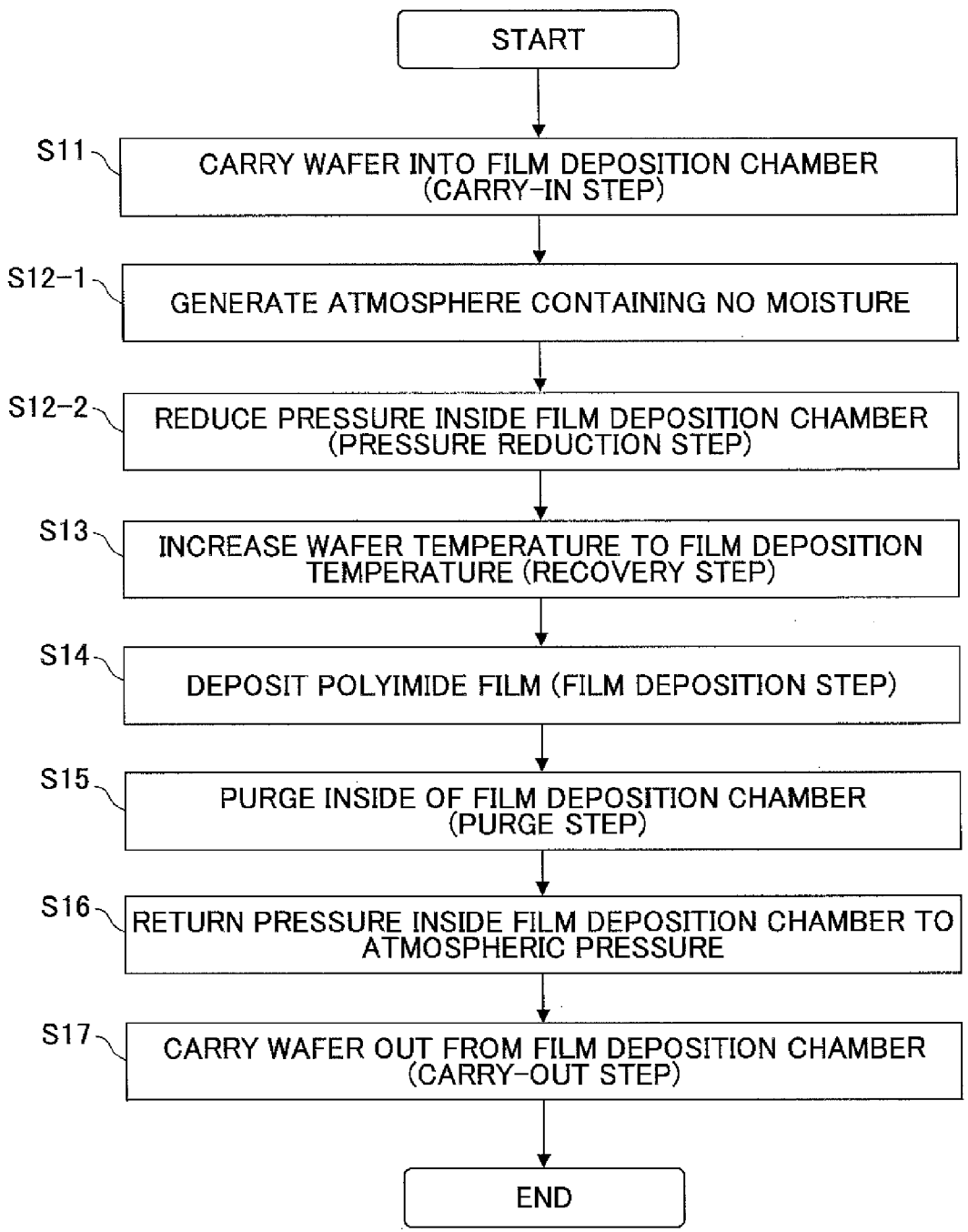
FIG. 6 is a flowchart for illustrating processes of steps including a film deposition process using the film deposition apparatus according to an embodiment of the present invention.

Next, a film deposition process using the above-described embodiment of the film deposition apparatus 10 is described. FIG. 6 is a flowchart for illustrating the processes of steps including a film deposition process using the film deposition apparatus 10 according to this embodiment.

After the start of a film deposition process, the wafers W are carried into the film deposition chamber 60 (Step S11, carry-in step). In the embodiment of the film deposition apparatus 10 illustrated in FIG. 1, in the loading area 20, the wafers W may be loaded into the boat 44a with the transfer mechanism 7 and the boat 44a loaded with the wafers W may be placed on the lid body 43 with the boat conveying mechanism 45c. Then, the lid body 43 on which the boat 44a is placed is caused to move upward by the elevation mechanism 46 to be inserted into the film deposition chamber 60, so that the wafers W are carried into the film deposition chamber 40.

Then, the internal pressure of the film deposition chamber 60 is reduced (Step S12, pressure reducing step). By controlling the exhaust capability of the exhaust device 96 or a flow regulating valve (not illustrated) provided between the exhaust device 96 and the exhaust pipe 97, the amount by which the film deposition chamber 60 is evacuated via the exhaust pipe 97 is increased. Thereby, an atmosphere containing no moisture is generated in the film deposition chamber 60. It is to be noted that the method for generating an atmosphere containing no moisture in the film deposition chamber 60 is not limited to the method of evacuating the film deposition chamber. That is, other methods may be used for generating the atmosphere containing no moisture in the film deposition chamber 60. Then, the internal pressure of the film deposition chamber 60 is reduced from a predetermined pressure such as an atmospheric pressure (760 Torr) to, for example, 0.3 Torr.

Then, the temperature of the wafer(s) W is increased to a predetermined temperature (film deposition temperature) for depositing a polyimide film on the wafer W (Step S13, recovery step). After the boat 44a is carried into the film deposition chamber 60, the wafer(s) W mounted on the boat 44a is heated to the film deposition temperature by supplying power to the heater 62.

Further, in the recovery step according to an embodiment of the present invention, the surface of the wafer W may be treated with an adhesion accelerating agent. In this case, the surface of the wafer W is treated by heating the wafer W with the heater 62 together with feeding an adhesion accelerating agent gas from the adhesion accelerating agent feed mechanism 80 to the inside of the film deposition chamber 60 and causing a reaction between the fed adhesion accelerating agent gas and the heated wafer W inside the atmosphere containing no moisture in the film deposition chamber 60 (surface treatment step).

Figure 8A:
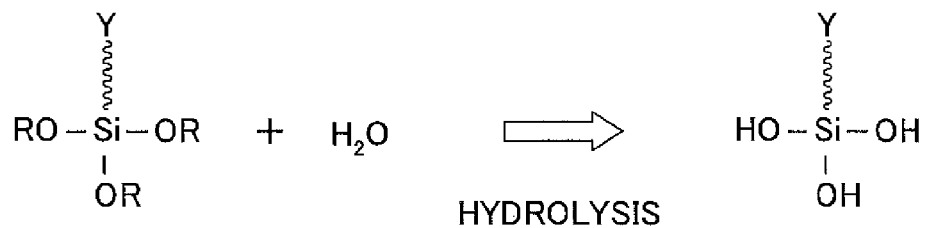
FIGS. 8A-8B are schematic diagrams illustrating a reaction on a surface of a wafer of a comparative example 1 in a case where a silane coupling agent and water vapor are used (part 1)
Figure 8B:
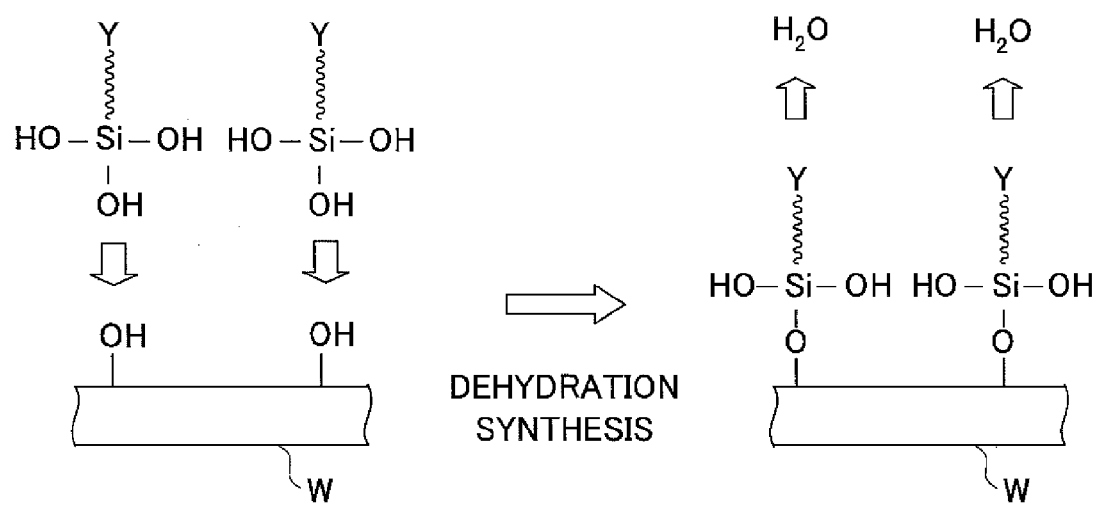
Figure 9:
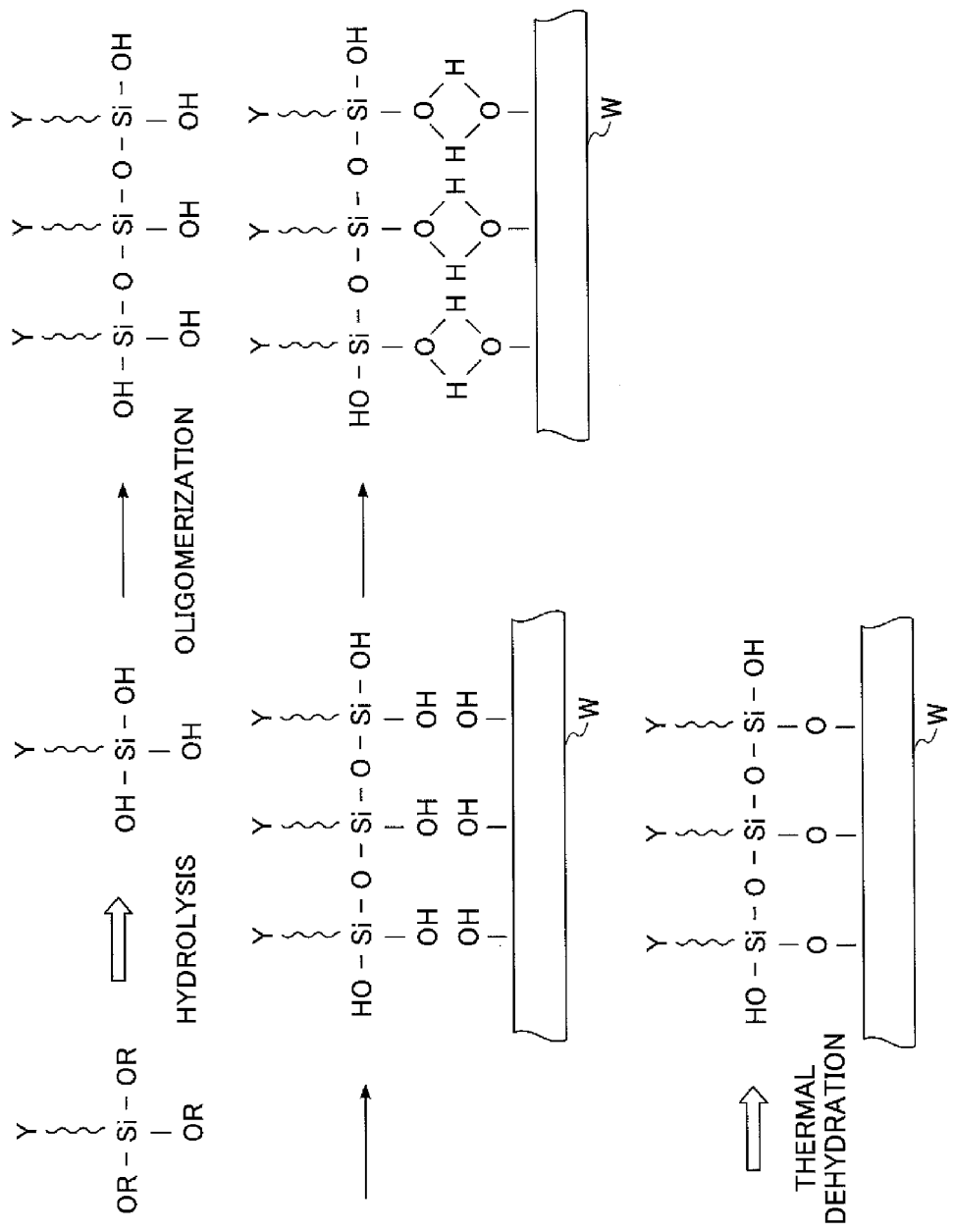
FIG. 9 is a schematic diagram illustrating a reaction on a surface of a wafer of the comparative example 1 in a case where a silane coupling agent and water vapor are used (part 2)

FIGS. 9A and 9B are schematic diagrams illustrating the reaction generated on the surface of the wafer W in a case where a silane coupling agent is used as the adhesion accelerating agent according to an embodiment of the present invention. FIGS. 8A, 8B, and 9 are schematic diagrams illustrating the reaction generated on the surface of the wafer W in a case where a silane coupling agent and a water vapor are used according to comparative example 1.

Figure 7A:
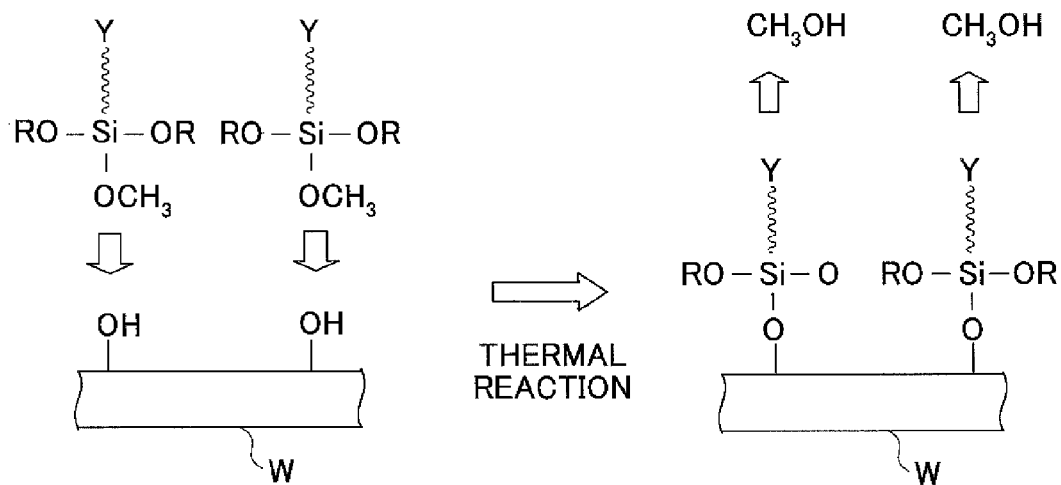
FIGS. 7A and 7B illustrate an example where a silane coupling agent is used as an adhesion accelerating agent according to an embodiment of the present invention.
Figure 7B:
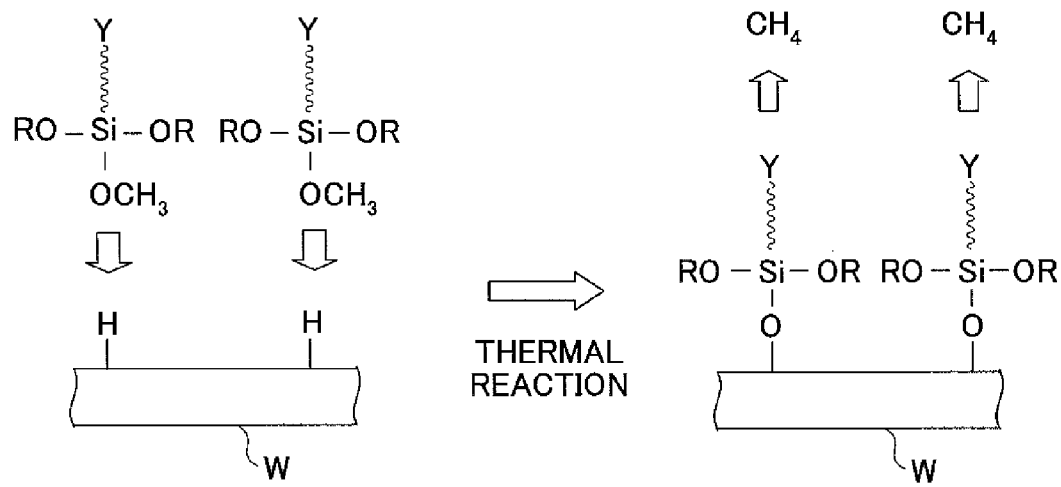

It is preferable to use organosilane having molecules containing an alkoxy group (RO— (R; alkyl group)) as the silane coupling agent. FIGS. 7A and 7B illustrate an example where organosilane having molecules containing, for example, a methoxy group ($CH_3O$—) is used. As illustrated in FIG. 7A, in a case of using a Si wafer having a hydroxyl group (—OH) terminated surface, methanol ($CH_3OH$) is generated by a thermal reaction between the methoxy group of the silane coupling agent and the hydroxyl group of the wafer surface. Thereby, the silane coupling agent adheres to the wafer surface. As illustrated in FIG. 7B, in a case of using a Si wafer having a hydrogen (H) terminated surface, methane ($CH_4$) is generated by a thermal reaction between the methoxy group of the silane coupling agent and the hydrogen atoms of the wafer surface. Thereby, the silane coupling agent adheres to the wafer surface.

N-phenyl-γ-aminopropyltrimethoxysilane (hereinafter also referred to as "SC agent A") illustrated in the following chemical formula (1) may be used as the organosilane.

[Chemical Formula (1)]

(1)

Alternatively, γ-glycidoxypropyltrimethoxysilane (hereinafter also referred to as "SC agent B") illustrated in the following chemical formula (2) may be used as the organosilane.

[Chemical Formula (2)]

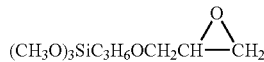

(2)

Among the aforementioned SC agents, it is more preferable to use the SC agent A. Even in a case of using a Si wafer having a surface terminated with hydrogen (H), the adhesive property of the polyimide film on the Si wafer can be improved by using the SC agent A. In the case of performing the recovery step along with the surface treatment step, the vaporizer 81 vaporizes an adhesion accelerating agent including, for example, the SC agent A or the SC agent B and feeds the vaporized adhesion accelerating agent (adhesion accelerating agent gas) into the film deposition chamber 60 via the feed opening 82a formed in the feeding tube 82. In a case where the SC agent A, for example, is used, a vaporization rate of 0.3 g/minute can be attained by heating the retaining container 83 to, for example, 150° C. with a heating mechanism 86 (described below with reference to Table 1). Further, in a case where the SC agent B, for example, is used, a vaporization rate of 0.3 g/minute can be attained by heating the retaining container 83 to, for example, 100° C. with a heating mechanism 86. In this case, N2 gas, which is an adhesion accelerating agent carrier gas, may be introduced at a flow rate of 0.1 slm.

On the other hand, with the comparative example 1, a silane coupling agent having molecules containing, for example, an alkoxy group and a water vapor are used. As illustrated in FIG. 8A, hydrolysis occurs between the alkoxy group of the silane coupling agent and the water vapor in the atmosphere. Thereby, the alkoxy group of the silane coupling agent becomes a hydroxyl group (—OH). Accordingly, in a case where a Si wafer having a hydroxyl group (—OH) terminated surface is used as the wafer W, dehydration synthesis occurs between the alkoxy group of the silane coupling agent and the hydroxyl group of the wafer surface as illustrated in FIG. 8B. Thereby, the silane coupling agent adheres to the wafer surface.

Alternatively, as illustrated in FIG. 9, a silane coupling agent may have an alkoxy group changed to a hydroxyl group by hydrolysis with water vapor and then oglimerized by a polymerization reaction. When the oglimerized silane coupling agent is brought closer to the Si wafer having a hydroxyl group (—OH) surface, the silane coupling agent is further subjected to thermal dehydration via an intermediate. Thereby, the silane coupling agent adheres to the wafer surface. Accordingly, with the comparative example 1, there is a risk of generation of particles due to the polymerization.

On the other hand, with the above-described embodiment of the present invention, generation of particles can be prevented because the silane coupling agent is not polymerized.

Further, because water vapor is used in the comparative example 1, the residual water vapor remaining inside the film deposition chamber may cause ring-opening of a five-membered ring of PMDA as illustrated in the following chemical formula (3).

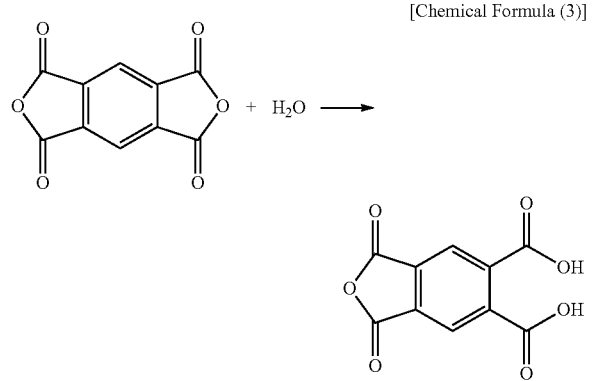

[Chemical Formula (3)]

If a five-membered ring of PMDA is opened, the property of the PMDA would change, and the reaction of PMDA and ODA would not progress in the film deposition step. As a result, a polyimide film cannot be deposited. On the other hand, according to an embodiment of the present invention, the reaction of PMDA and ODA can progress in the film deposition step because water vapor is not used. As a result, a polyimide film can be deposited.

Figure 10:
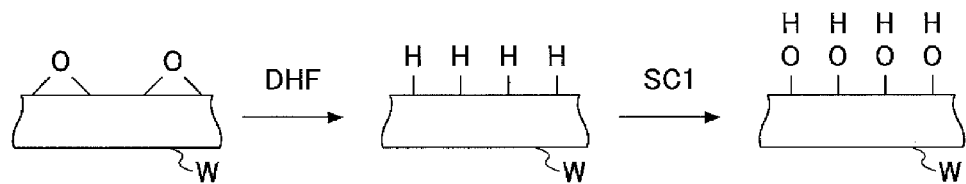
FIG. 10 is a schematic diagram illustrating the state of a wafer surface in a case of performing dilute hydrofluoric (DHF) cleaning on the wafer surface, then performing ammonia peroxide (standard clean, (SC) 1) on the wafer surface, and then terminating the wafer surface with a hydroxyl group by performing ammonia peroxide (standard clean, (SC) 1) cleaning on the wafer surface according to an embodiment of the present invention.

With the comparative example 1 where a Si wafer having a hydroxyl group-terminated surface is used, it is necessary to terminate the surface of a wafer W formed of Si with hydrogen atoms by dilute hydrofluoric (DHF) cleaning, and then terminate the surface of the wafer W with a hydroxyl group by ammonia peroxide (standard clean, (SC) 1) cleaning as illustrated in FIG. 10. Accordingly, the comparative example 1 requires to perform adjustment of the terminated wafer surface for a greater number of times (greater number of steps). On the other hand, with the embodiment of the present invention, both a wafer having a hydroxyl group-terminated surface or a wafer having a hydrogen-terminated surface can be used as the wafer W. Accordingly, the embodiment of the present invention can reduce the number of steps for adjusting the terminated wafer surface.

Figure 11:
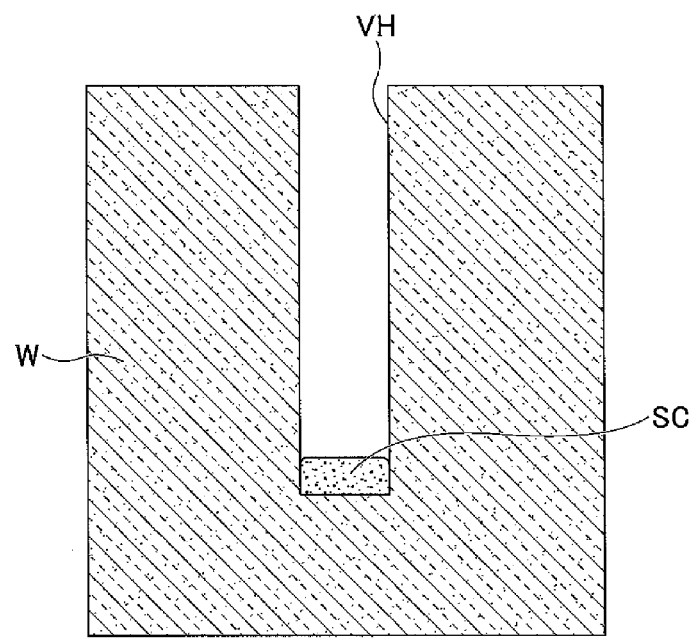
FIG. 11 is a cross-sectional view illustrating a state of the surrounding of a via hole of a wafer after performing surface treatment on the wafer by steeping the wafer into an adhesion accelerating agent liquid according to a comparative example 2.

Further, as comparative example 2, a wafer W is surface treated by being steeped into a liquid of an adhesion accelerating agent (adhesion accelerating agent liquid). FIG. 11 is a cross-sectional view illustrating a state of the surrounding of a via hole VH of a wafer W after performing surface treatment on the wafer W by steeping the wafer W into the adhesion accelerating agent liquid according to the comparative example 2.

As illustrated in FIG. 11, with the surface treatment of the comparative example 2, even when the adhesion accelerating agent becomes dry after performing surface treatment by steeping the wafer into the adhesion accelerating agent liquid, residue of the adhesion accelerating agent liquid may remain at the bottom of the via hole VH. For example, in a case where the via hole has an inner diameter of, for example, 54 µm and a depth of, for example, 52 µm, the residue of the adhesion accelerating agent liquid may accumulate to a height of, for example, 1 µm from the bottom of the via hole VH. On the other hand, no residue of the adhesion accelerating agent SC will remain at the bottom of the via hole VH of the wafer W because surface treatment according to an embodiment of the present invention is performed by feeding vaporized adhesion accelerating agent (adhesion accelerating agent gas) to the wafer W.

Next, a polyimide film is deposited (Step S14, film depositing step).

A first flow rate F1 at which the first source gas (PMDA gas) is caused to flow to the feeding tube 73a and a second flow rate F2 at which the second source gas (ODA gas) is caused to flow to the inner feeding tube 73b are determined in advance by the control part 100. The first source gas is caused to flow from the first source gas feeding part 71a to the feeding tube 73a at the determined first flow rate F1 and the second source gas is caused to flow from the second source gas feeding part 71b to the inner feeding tube 73b at the determined second flow rate F2 while the wafers W are being rotated by the rotation mechanism 49. Thereby, the first and the second source gases are mixed at a predetermined mixture ratio and fed into the film deposition chamber 60. PMDA and ODA are subjected to a polymerization reaction on the top surfaces of the wafers W so that a polyimide film is deposited on the top surfaces of the wafers W. Specifically, for example, the first flow rate F1 may be 900 sccm and the second flow rate F2 may be 900 sccm.

The polymerization reaction of PMDA and ODA at this point follows the following chemical formula (4).

[Chemical Formula (4)]

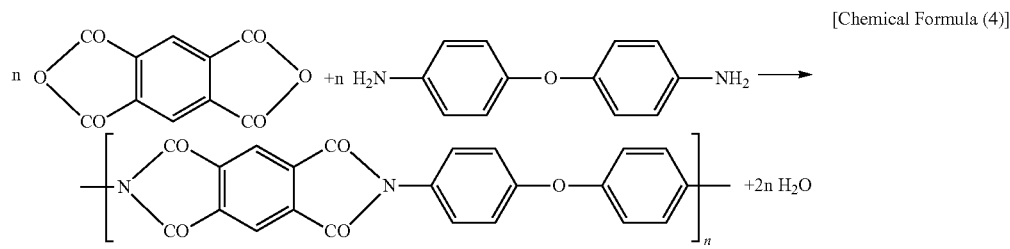

Then, the feeding of PMDA gas from the first source gas feeding part 71a and the feeding of ODA gas from the second source gas feeding part 71b are stopped, and the inside of the film deposition chamber 60 is purged with purge gas (Step S15, purge step).

More specifically, the feeding of the first source gas from the first source gas feeding part 71a is stopped by closing the valve 71c. Further, the feeding of the second source gas from the second source gas feeding part 71b is stopped by closing the valve 71d. Further, purge gas replaces the source gases inside the film deposition chamber 60 by controlling the purge gas feed mechanism 90 and the exhaust mechanism 95.

For example, by controlling the exhaust capability of the exhaust device 96 or adjusting a flow rate adjustment valve (not illustrated) provided between the exhaust device 96 and the exhaust pipe 97, the amount by which the film deposition chamber 60 is evacuated can be increased. Thereby, the pressure inside the film deposition chamber 60 can be reduced to, for example, 0.3 Torr. Then, the valve 93 is opened and purge gas is fed inside the film deposition chamber 60 from the purge gas feed mechanism 90 until the internal pressure inside the film deposition chamber 60 reaches, for example, 5.0 Torr. Thereby, the source gases inside the film deposition chamber 60 can be replaced with purge gas. In addition, after performing decompression of the exhaust mechanism 95 and feeding of purge gas from the purge gas feed mechanism 90 once, respectively, the decompression of the exhaust mechanism 95 and the feeding of purge gas may be performed for a further number of times. Thereby, the source gases inside the film deposition chamber 60 can be more positively replaced with purge gas.

was performed. The peeling test was performed by using 610-1PK (manufactured by 3M) having an adhesive strength of 3.7 M/cm as an adhesive tape and peeling the polyimide film from the wafer having the polyimide film deposited thereon. After performing the peeling test, the peeling yield was obtained by (n1/n0)×100 in a case where the number of specimens having the polyimide film remaining is assumed as "n1" and the total number of specimens is assumed as "n0". The results of the peeling test are illustrated in the following Table 1 together with vaporizer conditions and surface treatment conditions.

TABLE 1

| | VAPORIZER CONDITION | | SURFACE TREATMENT CONDITION | | | PEEL YIELD (%) | |
|---|---|---|---|---|---|---|---|
| SC AGENT | TEMPERATURE (° C.) | VAPORIZATION QUANTITY (g/MINUTES) | WAFER TEMPERATURE (° C.) | PRESSURE INSIDE FILM DEPOSITION CHAMBER | TIME (SECONDS) | Si—OH WAFER | Si—H WAFER |
| A | 150 | 0.3 | 200 | 10 | 600 | 100 | 100 |
| B | 100 | 0.3 | 200 | 10 | 600 | 100 | 0 |

According to an embodiment of the present invention, the polyimide film deposited on the wafer W may be thermally treated by a heater in the purge step. The thermal treatment is performed for imidizing parts of the deposited film that are not imidized after the film deposition step. Because polyimide has a high insulating property, the insulating property of the deposited polyimide film can be improved by increasing the imidization rate (i.e. proportion of polyimide in the deposited film). Then, the internal pressure of the film deposition chamber 60 is returned to an atmospheric pressure (Step S16, pressure recovery step). By controlling the exhaust capability of the exhaust device 96 or the flow regulating valve (not illustrated) provided between the exhaust device 96 and the exhaust pipe 97, the amount by which the film deposition chamber 60 is evacuated is reduced. The internal pressure of the film deposition chamber 60 is returned from, for example, 0.3 Torr to, for example, an atmospheric pressure (760 Torr).

As long as the thermal process of the deposited polyimide film is performed inside the film deposition chamber 60 before the below-described carry-out step, the thermal process may be performed during the recovery step or after the recovery step.

Then, the wafers W are carried out of the film deposition chamber 60 (Step S17, carry-out step). In the case of the film deposition apparatus 10 illustrated in FIG. 1, for example, the lid body 43 on which the boat 44a is placed may be caused to move downward by the elevation mechanism 46 to be carried out from inside the film deposition chamber 60 to the loading area 40. Then, the wafers W are transferred from the boat 44a placed on the carried-out lid body 43 to the container 21 by the transfer mechanism 47. Thereby, the wafers W are carried out of the film deposition chamber 60. Thereafter, the film deposition process ends.

In the case of successively subjecting multiple batches to a film deposition process, a further transfer of the wafers W from the container 21 to the boat 44 is performed in the loading area 40 by the transfer mechanism 47, and the process returns again to Step S11 to subject the next batch to a film deposition process.

In order to evaluate the adhesive property of the polyimide film deposited in the above-described manner, a peeling test In Table 1, an Si wafer having a surface terminated with a hydroxyl group (hereinafter also referred to as "OH terminated wafer") and a Si wafer having a surface terminated with hydrogen (hereinafter also referred to as "H terminated wafer") are illustrated.

As illustrated in Table 1, in a case of feeding the SC agent B into the film deposition chamber 60 having an internal pressure of 10 Torr with a vaporization rate of 0.3 g/minute and treating the wafer surface in a wafer temperature of 200° C. for 600 seconds, the peeling yield of the OH terminated wafer is 100% whereas the peeling yield of the H terminated wafer is 0%. On the other hand, the peeling yield for both the OH terminated wafer and the H terminated wafer is 100% in a case of feeding the SC agent A into the film deposition chamber 60 having an internal pressure of 10 Torr with a vaporization rate of 0.3 g/minute and treating the wafer surface in a wafer temperature of 200° C. for 600 seconds.

Figure 12:
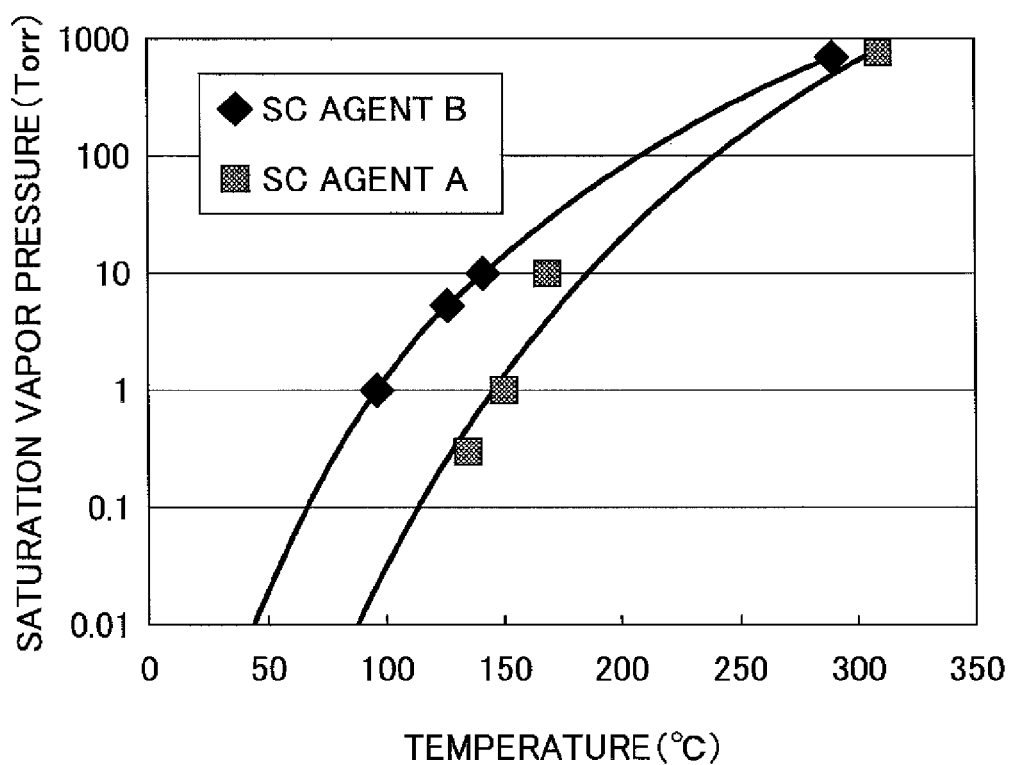
FIG. 12 is a graph illustrating the dependency of saturation vapor pressure of SC agents A and B with respect to temperature.

One example for explaining the reason that the adhesive property is higher in the case of using the SC agent A than the case of using the SC agent B is as follows. Table 2 illustrates the molecular weight, the boiling point, and the saturation vapor pressure in a temperature of 200° C. corresponding to the SC agents A and B. FIG. 12 is a graph illustrating the dependency of the saturation vapor pressure of the SC agents A and B with respect to temperature.

TABLE 2

| SC AGENT | A | B |
|---|---|---|
| MOLECULAR WEIGHT | 255.39 | 236.3 |
| BOILING POINT (° C.) | 310 | 290 |
| SATURATION VAPOR PRESSURE IN 200° C. (Torr) | 20 | 90 |

As illustrated in Table 2, the molecular weight of the SC agent A is greater than the molecular weight of the SC agent B, and the boiling point of the SC agent A is higher than the boiling point of the SC agent B. Thus, as illustrated in Table 2 and FIG. 12, the saturation vapor pressure of the SC agent A in a temperature of 200° C. (20 Torr) is less than the saturation vapor pressure of the SC agent B in a temperature of 200° C. (90 Torr). Therefore, the adhesion accelerating agent including the SC agent A can remain on the wafer surface for a longer time compared to the adhesion accelerating agent including the SC agent B. Therefore, surface treatment can be performed more consistently with the SC agent A than the SC agent B. Furthermore, because the SC agent A is more stable under a high temperature compared to the SC agent B, the property of the adhesion accelerating agent including the SC agent A can prevented from changing even in a case of heating the wafer W.

Hence, in a case of performing surface treatment on an Si wafer having a hydroxyl group terminated surface, adhesive property can be improved even where the surface treatment is performed in an atmosphere containing no moisture. In a case of performing surface treatment on an Si wafer having a hydrogen terminated surface, adhesive property can be improved even where the surface treatment is performed in an atmosphere containing no moisture by using a silane coupling agent having a relatively high molecular weight, a relatively high boiling point, and a relatively low saturation vapor pressure as the adhesion accelerating agent.

Although this embodiment of the present invention is explained using an example of treating the surface of an Si wafer, the surface treating method according to this embodiment may be applied to a case of treating the surface of other various substrates such as glass.

Similarly, although this embodiment of the present invention is explained using an example where surface treatment is performed until the temperature of the wafer reaches a predetermined temperature inside the film deposition chamber 60, the surface treatment may be performed in a container (chamber) separate from the film deposition chamber 60 before conveying the wafer W is conveyed into the film deposition chamber 60.

[First Modified Example of First Embodiment]

Next, a surface treatment method and a film deposition method according to a modified example of the first embodiment is described with reference to FIG. 13.

With the surface treatment method and the film deposition method of the modified example, unlike the above-described surface treatment method and the film deposition method of the first embodiment, the surface of the Si wafer is nitrided.

In the modified example, a nitriding apparatus separate from the film deposition apparatus or the surface treatment apparatus is used. Further, in the modified example, the surface of the Si wafer is nitrided before treating the surface of the Si wafer with the adhesion accelerating agent. As one example, a film deposition apparatus including a plasma generating part may be used (see, for example, FIG. 13).

It is to be noted that, except for a film deposition chamber 60a, the film deposition apparatus used for performing the surface treatment method and the film deposition method of the modified example may have the same configuration as that of the film deposition apparatus 10 of the first embodiment. Thus, detailed description of components/mechanisms other than the film deposition chamber 60a is omitted. In the description and drawing of the modified example, like components/mechanisms are denoted with like reference numerals as those of the first embodiment and are not further described.

Figure 13:
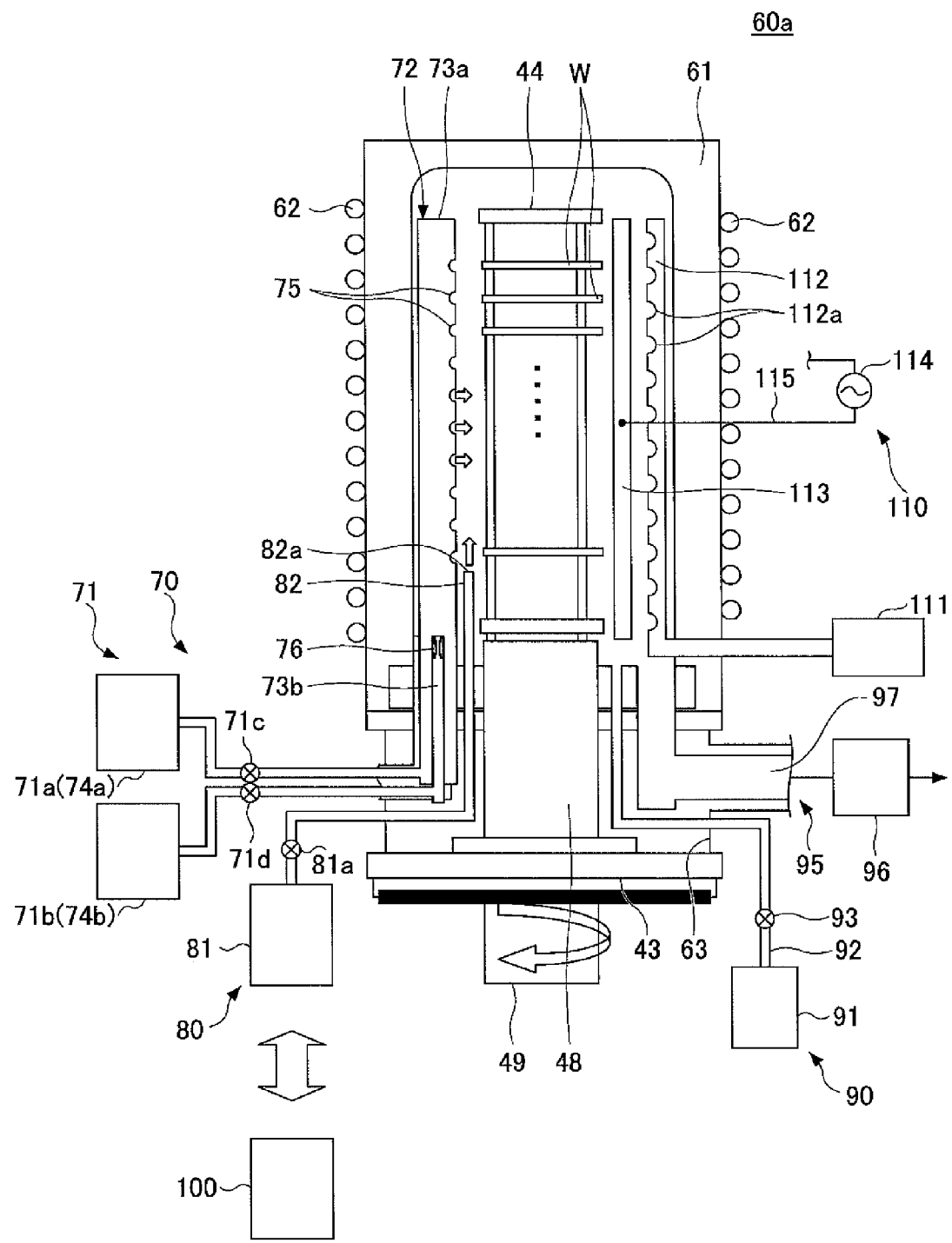
FIG. 13 is a cross-sectional view illustrating a configuration of a film deposition chamber according to an embodiment of the present invention.

FIG. 13 is a cross-sectional view illustrating a configuration of the film deposition chamber 60a according to the modified example of the first embodiment of the present invention.

The film deposition chamber 60a includes the reaction tube 61, the heater 62, the feed mechanism 70, the adhesion accelerating agent feed mechanism 80, the purge gas feed mechanism 90, the exhaust mechanism 95, and a plasma generating part 110. The film deposition chamber 60a of the modified example has the same components/mechanisms as those of the film deposition chamber 60 of the first embodiment except for the plasma generating part 110. Thus, detailed description of components/mechanisms other than the plasma generating part 110 is omitted.

The plasma generating part 110 includes a plasma gas feeding source 111, a plasma gas dispersing nozzle 112, a pair of plasma electrodes 113, and a high frequency power supply 114.

The plasma gas feeding source 111 is provided outside the film deposition chamber 60a for feeding plasma gas (gas to be formed into plasma) such as ammonia ($NH_3$) gas. The plasma gas dispersing nozzle 112, which is made of quartz, penetrates through the sidewall of the reaction tube 61 and bends in a manner extending upward. The plasma gas dispersing nozzle 112 is connected to the plasma gas feeding source 111. The plasma gas dispersing nozzle 112 is formed with plural gas ejection openings 112a arranged at predetermined intervals in the longitudinal direction of the plasma gas dispersing nozzle 112, so that ammonia gas can be substantially evenly ejected from each of the gas ejection openings 112a in a horizontal direction.

The plasma electrodes 113 are a pair of elongated electrodes facing each other and provided between the plasma gas dispersing nozzle 112 and boat 44 in a manner extending in a vertical direction. The high frequency power supply 114 is configured to cause generation of plasma by applying a high frequency voltage (e.g., 13.56 MHz) to the plasma electrodes 113.

In the modified example, the surface of the Si wafer is nitrided in the recovery step (Step S13 in FIG. 6) before performing surface treatment on the Si wafer. The plasma gas feeding source 111 feeds a plasma gas (e.g., ammonia ($NH_3$) gas) into the film deposition chamber 60a via the gas ejection openings 112a of the plasma gas ejection nozzle 112. Then, the high frequency power supply 114 applies a high frequency voltage of, for example, 13.56 MHz to the plasma electrodes 113. Thereby, the gas ($NH_3$ gas) ejected from the gas ejection openings 112a of the plasma gas ejection nozzle 112 is plasmized and activated between the pair of plasma electrodes 113 applied with the high frequency voltage. As a result, radicals such as N*, NH2*, or NH3* are generated. The generated radicals, which are released and spread inside the film deposition chamber 60a, react to the wafer W, to thereby form a silicon nitride (SiN) layer on the surface of the wafer W.

Then, similar to the first embodiment, the surface of the wafer W can be treated with the adhesion accelerating agent in the recovery step. Thus, by heating the wafer W and causing a reaction between the heated wafer W and the adhesion accelerating agent gas supplied into the film deposition chamber 60a in an atmosphere containing no moisture, the surface of the wafer W is treated (surface treating step).

It is preferable for a silane coupling agent to be used as the adhesion accelerating agent in the modified example. An organosilane having molecules containing an alkoxy group may be used as the silane coupling agent. In a case where organosilane having molecules containing, for example, a methoxy group is used, the surface of the wafer W held by the boat 44 is terminated with nitride (—N). Therefore, as illustrated with the following chemical formula 5, the methoxy group of the silane coupling agent thermally reacts with the wafer surface and adheres to the wafer surface.

[Chemical Formula 5]

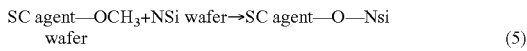

(5)

In the modified example, it is preferable to use SC agents A and B (see above-described chemical formulas 1 and 2) as the organosilane. In a case of using the SC agent B, the SC agent B can be used in a state where the surface of the wafer is terminated with nitrogen (i.e. nitrided) when the wafer is a Si wafer having its surface terminated with hydrogen atoms (H) (i.e. hydrogen terminated wafer). Therefore, the adhesive property of the deposited polyimide film can be improved.

A peeling test for evaluating the adhesive property was also performed on the deposited polyimide film of the modified example. In the comparative example 3, hydrogen termination is performed on a wafer having a surface that is not nitrided. Then, the SC agent B is fed into a film deposition chamber with a vaporization rate of 0.3 g/minute, and the surface of the wafer is treated in a wafer temperature of 90° C. for 60 seconds. As a result, the peeling yield was 0%. On the other hand, with the modified example, hydrogen termination is performed on a wafer having a surface that is nitrided. Then, the SC agent B is fed into the film deposition chamber 60a with a vaporization rate of 0.3 g/minute, and the surface of the wafer is treated in a wafer temperature of 200° C. for 600 seconds. As a result, the peeling yield was 100%.

In the modified example, a supplied adhesion accelerating agent gas and a heated wafer react to each other in an atmosphere containing no moisture. Accordingly, the property of the film deposited on the treated surface of the wafer does not change, and no particles are generated during surface treatment. Further, the number of steps for adjusting the termination state of the wafer surface can be reduced beforehand.

[Second Modified Example of First Embodiment]

Next, a surface treating method and a film depositing method according to a second modified example of the first embodiment of the present invention are described with reference to FIG. 14.

Unlike the film depositing method of the first embodiment, the surface of the substrate is treated with a first source gas after treating the surface of the substrate with the adhesion accelerating agent but before depositing the polyimide film on the substrate surface. It is to be noted that the description of the film deposition apparatus 10 of the first embodiment may be applied to the description of the film deposition apparatus used for performing the surface treating method and the film depositing method of the second modified example.

Figure 14:
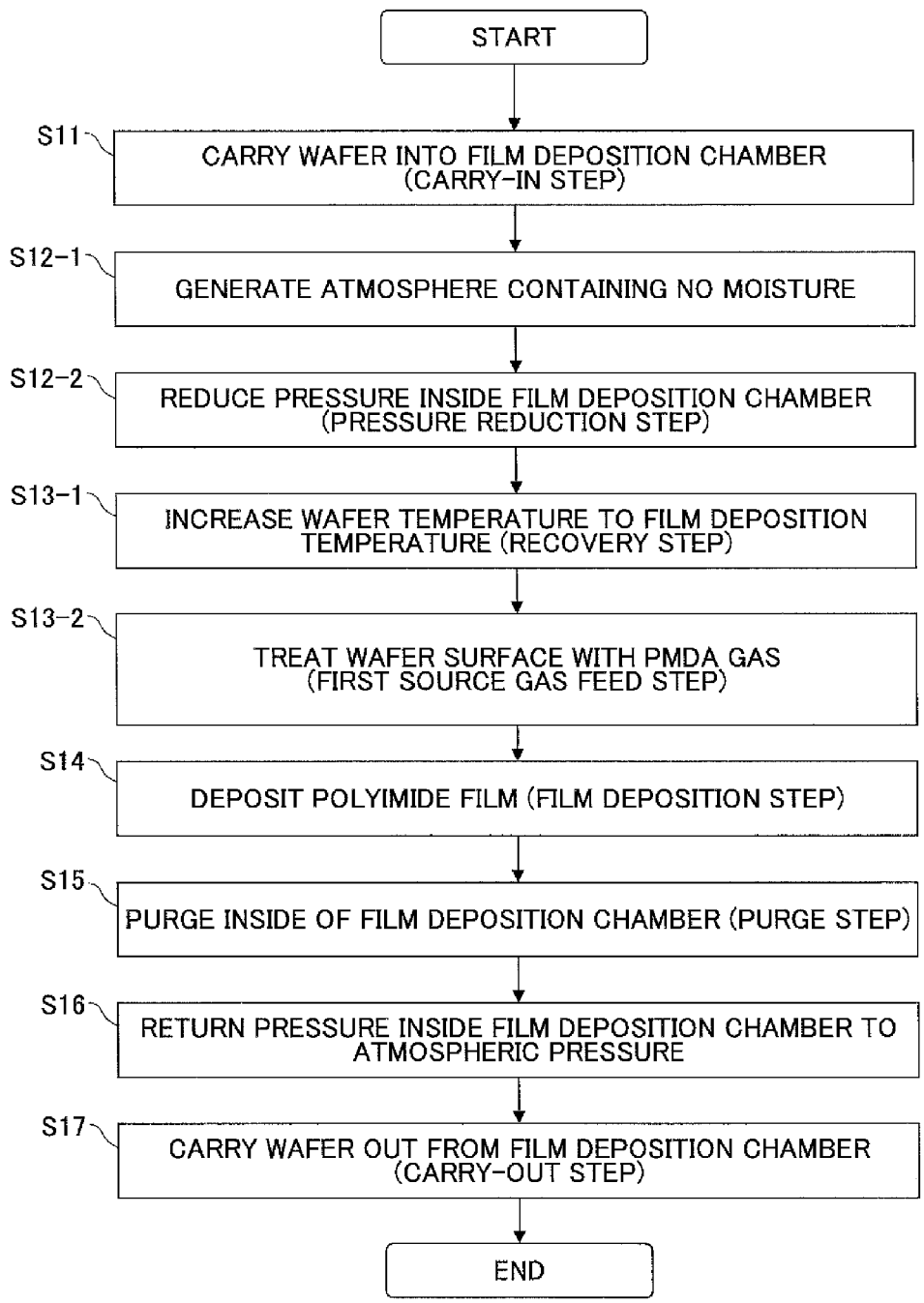
FIG. 14 is a flowchart for describing steps of a film depositing method according to a second modified example of the first embodiment of the present invention.

FIG. 14 is a flowchart for describing steps of a film depositing method according to the second modified example of the first embodiment.

In the second modified example, the surface of the wafer W is processed with the first source gas by feeding the first source gas from the first source gas feeding part 71a (Step S13-2, first source gas feed step) after the recovery step (Step S13) but before the film deposition step (Step S14). Other than the first source gas feed step (Step S13-2), the film depositing method of the second modified example is the same as that of the first embodiment.

In the second modified example, the adhesion accelerating agent gas and the heated wafer W are made to react with each other inside an atmosphere containing no moisture. Thereby, the property of the film deposited on the surface treated wafer can be prevented from changing and particles can be prevented from being generated in the surface treating process. As a result, the preliminary steps for adjusting the termination state of the wafer surface can be reduced.

Further, in the second modified example, a polyimide film can be evenly deposited on the entire surface of the wafer W in the film deposition step (S14) after the first source gas feed step (S13-2).

For example, in a case where the first source gas feed step is added, the evenness of the film thickness of the deposited polyimide film (in-plane evenness: 1σ) was reduced from 14.3% to 2.3% under substantially the same processing conditions of the first embodiment. This is regarded to be the result of PMDA adhering to the entire surface of the wafer owing to a reaction between the PMDA and the functional group provided on the side opposite of the Si wafer surface on which the silane coupling agent is adhered.

[Second Embodiment]

Next, a surface treating method and a film depositing method according a second embodiment of the present invention are described with reference to FIGS. 15-17.

As described below, unlike the surface treating method and the film depositing method of the first embodiment, the film deposition apparatus of the second embodiment includes a deposition container configured to perform single wafer processing and has a process chamber (for performing surface treatment) provided separately from the film deposition chamber.

Figure 15:
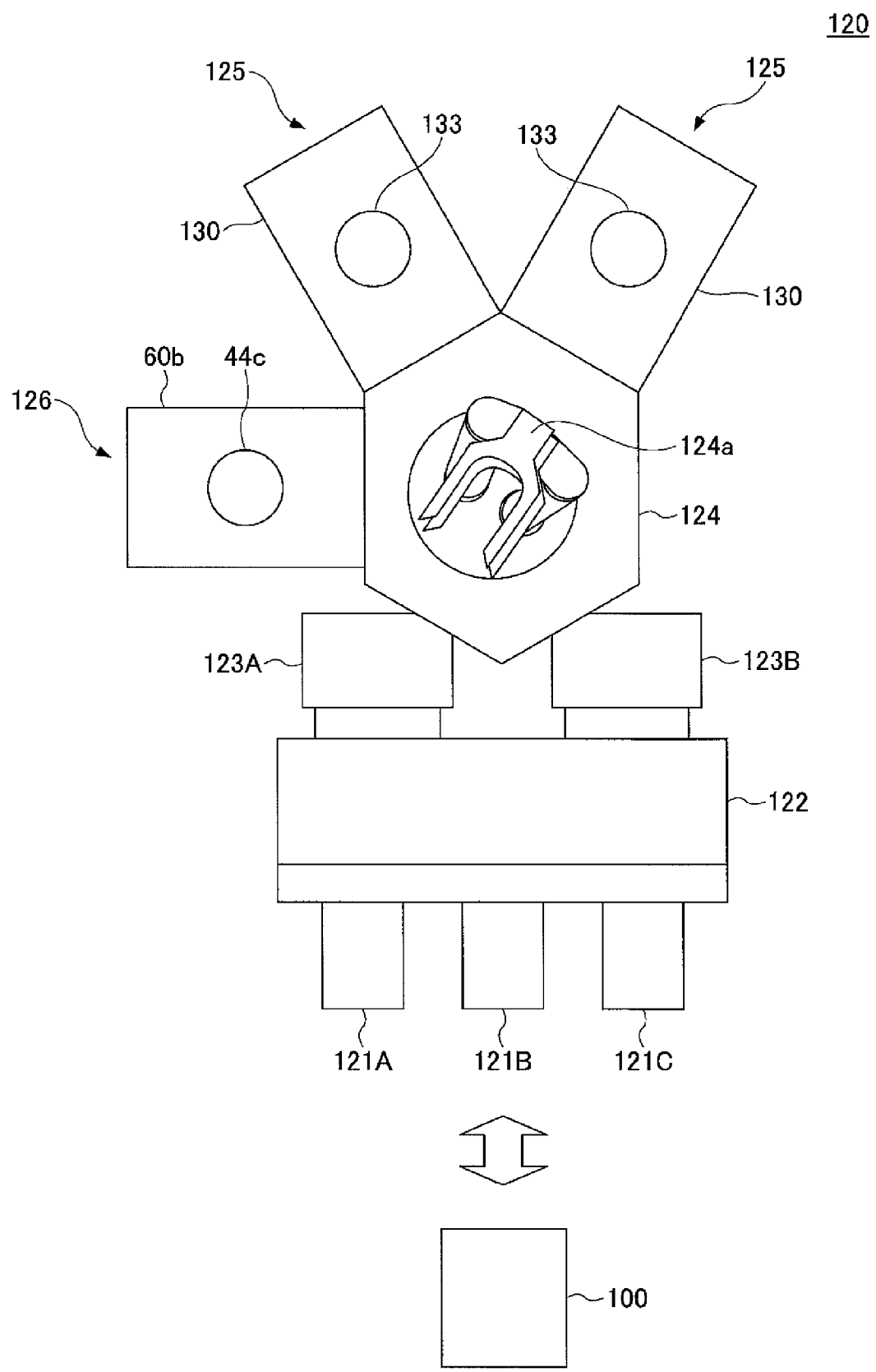
FIG. 15 is a plan view illustrating a film deposition apparatus for performing a surface treating method and a film depositing method according to a second embodiment of the present invention.

FIG. 15 is a plan view illustrating a film deposition apparatus 120 for performing the surface treating method and the film depositing method according to the second embodiment of the present invention. FIG. 16 is a front view illustrating the configurations of a process container 130, the adhesion accelerating agent feed mechanism 80, and an exhaust mechanism 95a according to the second embodiment of the present invention. FIG. 17 is a plan view illustrating the configurations of a film deposition chamber 60b, the feed mechanism 70, and the exhaust mechanism 95b according to the second embodiment of the present invention.

As illustrated in FIG. 15, the film deposition apparatus 120 includes ports 121A-121C, a loader 122, load locks 123A, 123B, a conveying chamber 124, plural surface treating parts 125, and a film depositing part 126.

The loader 122 is connected to the ports 121A-121C. The load locks 123A, 123B are connected to the loader 122. The conveying chamber 124 is connected to the load locks 123A, 123B. Two surface treating parts 125 and the film depositing part 126 are connected to the conveying chamber 124. The conveying chamber 124 includes a conveying arm 124a for conveying a wafer(s) between the load locks 123A, 123B, the surface treating parts 125, and the film depositing part 126.

It is to be noted that the number of the film depositing parts 125 and the film depositing parts 126 is not to be limited in particular and may be discretionarily changed according to surface treating conditions and film depositing conditions for improving throughput.

Figure 16:
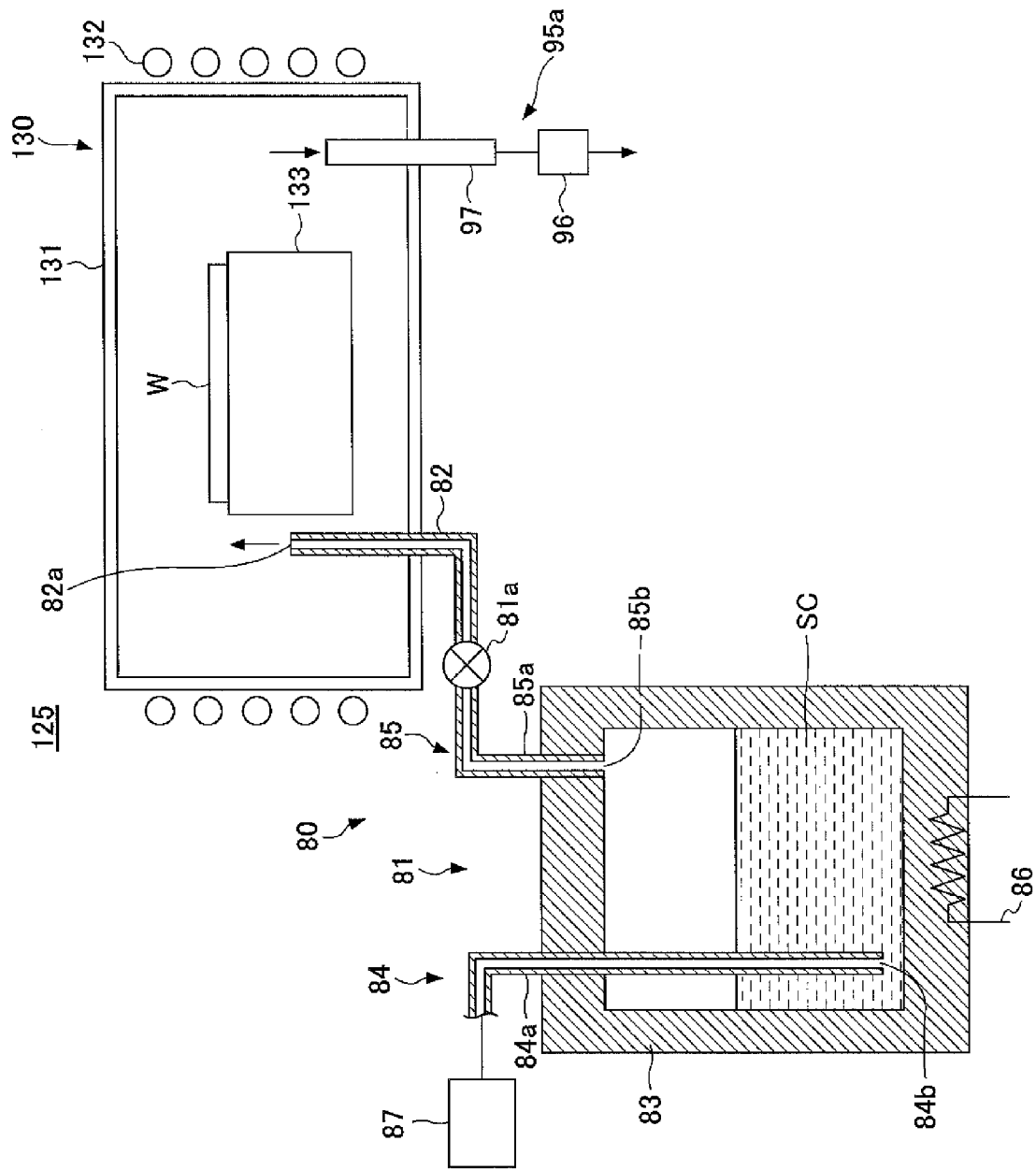
FIG. 16 is a front view illustrating configurations of a process container, an adhesion accelerating agent feed mechanism, and an exhaust mechanism according to the second embodiment of the present invention.

As illustrated in FIGS. 15 and 16, the surface treating part 125 includes the process container 130, the adhesion accelerating agent feed mechanism 80, and the exhaust mechanism 95a.

The adhesion accelerating agent feed mechanism 80 includes the vaporizer 81, and the feeding tube 82. Except for the feeding tube 82 being provided inside the process container 130, the adhesion accelerating agent feed mechanism 80 of the second embodiment is the same as the adhesion accelerating agent feed mechanism 80 of the first embodiment. The exhaust mechanism 95a includes the exhaust device 96 and the exhaust pipe 97 and has substantially the same configuration as the exhaust mechanism 95 provided in the film deposition chamber 60 of the first embodiment.

The process container 130 includes a process chamber 131, a heater (heating device) 132, a substrate holding part 133, and the exhaust mechanism 95a. The heater (heating device) 132 is for heating the wafer W when performing surface treatment on the wafer W. The substrate holding part 133 is for holding the wafer W. The substrate holding part 133 is configured to hold a single wafer W. The heater (heating device) 132 may be provided inside the substrate holding part 133.

Figure 17:
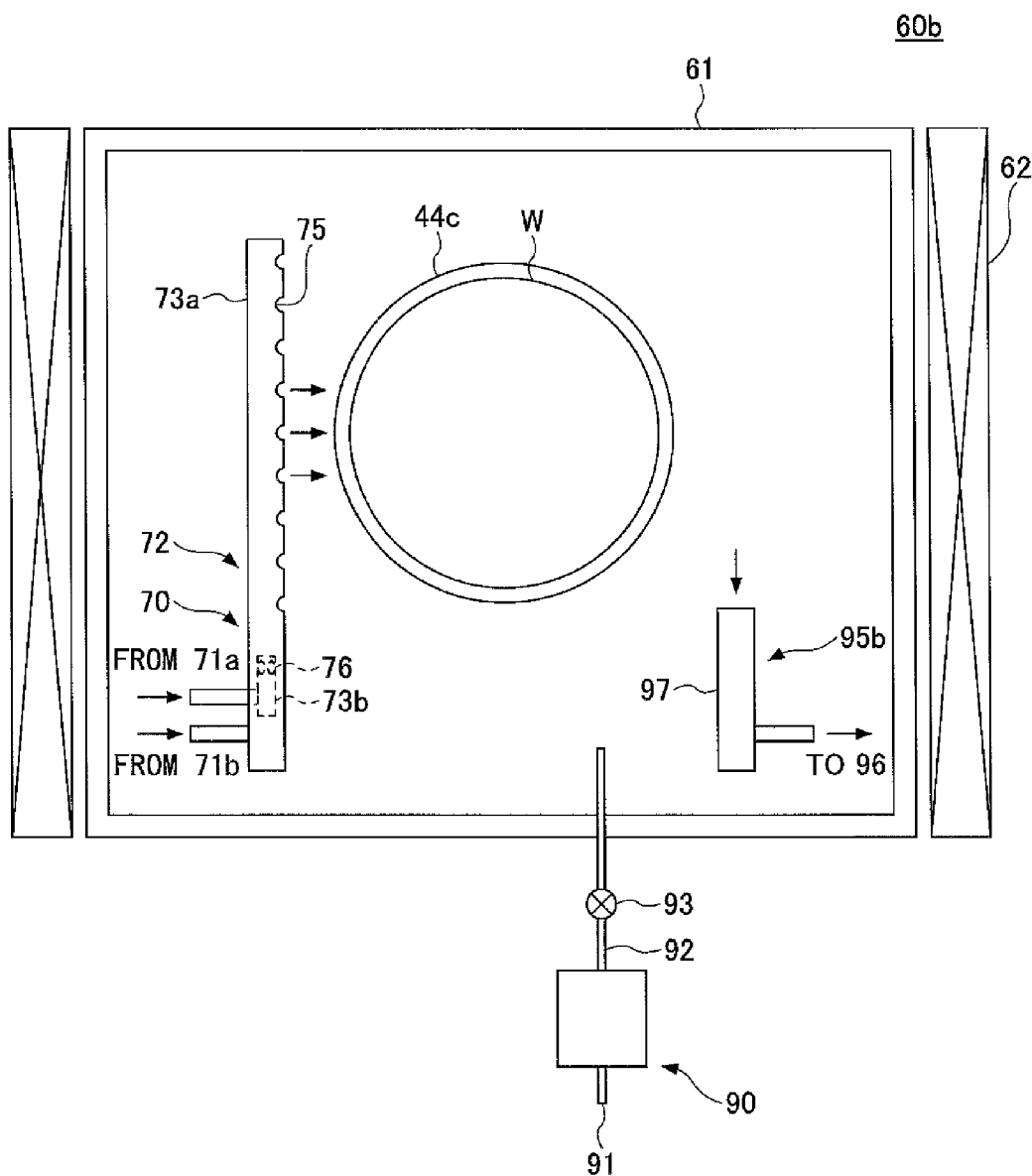
FIG. 17 is a plan view illustrating configurations of a film deposition chamber, a feed mechanism, and an exhaust mechanism according to the second embodiment of the present invention.

As illustrated in FIG. 17, the film depositing part 126 includes the film deposition chamber 60b, the feed mechanism 70, the purge gas feed mechanism 90, and the exhaust mechanism 95b. The purge gas feed mechanism 90 of the second embodiment has substantially the same configuration as that of the purge gas feed mechanism of the first embodiment and includes the purge gas feeding part 91, the purge gas feeding tube 92, and the valve 93. The exhaust mechanism 95b of the second embodiment has substantially the same configuration as that of the exhaust mechanism 95 of the first embodiment and includes the exhaust device 96 and the exhaust tube 97.

The film deposition chamber 60b includes a reaction chamber 61, a heater (heating device) 62, and a substrate holding part 44c. The substrate holding part 44c is configured to hold a single wafer W.

The feed mechanism 70 includes the first source gas feeding part 71a, the second source gas feeding part 71b, and the injector 72. The first and the second source gas feeding parts 71a, 71b of the second embodiment have substantially the same configurations as those of the first embodiment.

The injector 72 includes the feeding tube 73a and the inner feeding tube 73b. The source gas feeding part 71 is connected to the feeding tube 73a of the injector 72. Other than the feeding tube 73a and the inner feeding tube 73b being arranged in a manner extending in a horizontal direction, the injector 72 of the second embodiment has substantially the same configuration as that of the first embodiment. That is, plural feed openings 75 are formed in the feeding tube 73a. Further, the opening(s) 76 may be formed in the vicinity of a downstream side of the inner feeding tube 73b for feeding the first source gas to the inner space of the feeding tube 73a.

It is to be noted that FIG. 17 illustrates an example where the first source gas is fed from the first source gas feeding part 71a to the inner feeding tube 73b and the second source gas is fed from the second source gas feeding part 71b to the feeding tube 73a. Alternatively, the first source gas may be fed to the feeding tube 71b and the second source gas may be fed to the inner feeding tube 73b.

The control part 100 of the second embodiment has substantially the same configuration as that of the first embodiment.

In the film deposition process of the second embodiment, the surface of the wafer W is treated with the adhesion accelerating agent by the surface treating part 125 before the film depositing part 126 performs film deposition.

The conveying arm 124a of the conveying chamber 124 transfers the wafer W to the substrate holding part 133 provided inside the process container 130 of the surface treating part 125. Then, the exhaust mechanism 95a decompresses the inside of the process container 130.

Then, by controlling the power supplied to the heater 132 with the control part 100, the temperature of the wafer W is increased to a treatment temperature for treating the surface of the wafer W. Then, while the wafer W is being heated, the adhesion accelerating gas fed into the process container 130 and the heater wafer W are made to react to each other inside an atmosphere containing no moisture, so that the surface of the wafer W is treated (surface treatment step).

In the above-described modified examples, it is preferable to use a silane coupling agent as the adhesion accelerating agent. An organosilane having molecules containing an alkoxy group may be used as the silane coupling agent in modified examples. It is preferable to use SC agents A and B (see above-described chemical formulas 1 and 2) as the organosilane. Further, in a case of using the SC agent A, the SC agent A can be used in a state where the Si wafer is terminated with hydrogen atoms (H). Thereby, the adhesive property of the deposited polyimide film can be improved.

Accordingly, after performing surface treatment with the adhesion accelerating agent by using the surface treating part 125, the film depositing part 126 performs film deposition. Except for the film deposition of the film deposition part 126 being performed by single-wafer process instead of a batch process, the film deposition step of the second embodiment is substantially the same as the film deposition step of the first embodiment.

Similar to the first embodiment, the second embodiment may have the adhesion accelerating agent gas and the heated wafer react with each other inside an atmosphere containing no moisture. Thereby, the property of the film deposited on the surface treated wafer can be prevented from changing and particles can be prevented from being generated in the surface treating process. As a result, the preliminary steps for adjusting the termination state of the wafer surface can be reduced.

Similar to the modified example of the first embodiment, the second embodiment may also have a plasma generating part provided inside the process container 130 or a plasma process container separate from the process container 130. Accordingly, the surface of the Si wafer W can be nitrided by radiating a nitrogen plasma generated from the plasma generating part, and the nitrided surface of the W can react with the adhesion accelerating agent gas inside the process container 130.

In the second embodiment, the first source gas supplying step may be performed after processing the surface of the wafer W with the adhesion accelerating agent but before depositing the polyimide film. Thereby, similar to the second modified example of the first embodiment, the polyimide film can be evenly deposited on the entire surface of the wafer in the film deposition step.

Further, the present invention is not limited to these embodiments, but various variations and modifications may be made without departing from the scope of the present invention.

What is claimed is:

1. A surface treating method for treating a surface of a substrate inside a process chamber; the method comprising the steps of:

generating an atmosphere containing no moisture in the process chamber;

heating the substrate inside the atmosphere containing no moisture in the process chamber; and causing a reaction between the substrate and an adhesion accelerating agent by feeding the adhesion accelerating agent gas into the process chamber, wherein the process chamber is a container that deposits a film on the substrate by having a source gas fed therein, and wherein the step of causing the reaction between the substrate and the adhesion accelerating agent includes feeding the adhesion accelerating agent gas into the process chamber until the substrate is heated to a predetermined temperature for depositing the film and treating the surface of the substrate with the adhesion accelerating agent gas.

2. The method as claimed in claim 1, wherein a silane coupling agent is used as the adhesion accelerating agent.

3. The method as claimed in claim 2, wherein a coupling agent containing organosilane is used as the silane coupling agent.

4. The method as claimed in claim 1, wherein a silicon substrate is used as the substrate.

5. The method as claimed in claim 4, wherein a silicon substrate having a surface terminated with hydrogen is used as the silicon substrate.

6. The method as claimed in claim 4, wherein a silicon substrate having a nitrided surface is used as the silicon substrate.

7. A film depositing method comprising the steps of:
generating an atmosphere containing no moisture in a film deposition chamber for depositing a film on a substrate;
supplying an adhesion accelerating agent gas into the film deposition chamber until the substrate is heated to a predetermined temperature for depositing the film;
treating a surface of the substrate with the adhesion accelerating agent gas inside the atmosphere containing no moisture in the film deposition chamber; and
depositing the film on the substrate by feeding a source gas into the film deposition chamber after the step of treating the surface of the substrate.

8. The method as claimed in claim 7,
wherein the step of depositing the film on the substrate includes depositing a polyimide film on the substrate by feeding a first source gas formed of dianhydride and a second source gas formed of diamine into the film deposition chamber,
wherein the step of treating the surface of the substrate includes treating the surface of the substrate with the first source gas by feeding the first source gas into the film deposition chamber.

* * * * *